US012796012B2

(12) United States Patent
Yoshikawa

(10) Patent No.: US 12,796,012 B2
(45) Date of Patent: Nov. 10, 2026

(54) SEMICONDUCTOR DEVICE

(71) Applicant: FUJI ELECTRIC CO., LTD., Kanagawa (JP)

(72) Inventor: Koh Yoshikawa, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 372 days.

(21) Appl. No.: 18/513,672

(22) Filed: Nov. 20, 2023

(65) Prior Publication Data

US 2024/0088214 A1 Mar. 14, 2024

Related U.S. Application Data

(63) Continuation of application No. PCT/JP2022/047683, filed on Dec. 23, 2022.

(30) Foreign Application Priority Data

Dec. 23, 2021 (JP) ................................. 2021-209023

(51) Int. Cl.
*H10D 62/10* (2025.01)
*H10D 64/00* (2025.01)

(52) U.S. Cl.
CPC ......... *H10D 62/106* (2025.01); *H10D 62/112* (2025.01); *H10D 64/112* (2025.01); *H10D 64/118* (2025.01)

(58) Field of Classification Search
CPC .. H10D 64/112; H10D 64/118; H10D 62/106; H10D 62/112
See application file for complete search history.

(56) References Cited

U.S. PATENT DOCUMENTS 4,633,292 A * 12/1986 Fellinger ................ H10D 30/66 257/490
4,691,224 A 9/1987 Takada
(Continued)

FOREIGN PATENT DOCUMENTS

JP S4936513 B1 10/1974
JP S592368 A 1/1984
(Continued)

OTHER PUBLICATIONS

International Search Report and Written Opinion (ISA/237) of the International Search Authority for International Patent Application No. PCT/JP2022/047683, mailed by the Japan Patent Office on Mar. 20, 2023.

(Continued)

*Primary Examiner* — Britt Hanley
*Assistant Examiner* — Casey Paul Boatman

(57) ABSTRACT

An edge termination structure portion has one or more guard rings of a second conductivity type that are provided between a well region and an end side of a semiconductor substrate, and are exposed to an upper surface of the semiconductor substrate, a first conductivity type region that is provided between a first guard ring that is closest to the well region, among the one or more guard rings, and the well region, and a first field plate that is provided above the upper surface of the semiconductor substrate, and is connected to the first guard ring, and the first field plate overlaps 90% or more of the first conductivity type region between the first guard ring and the well region.

22 Claims, 15 Drawing Sheets

(56) References Cited

U.S. PATENT DOCUMENTS

| | | | | |
|---|---|---|---|---|
| 5,804,868 | A | 9/1998 | Kobayashi | |
| 2006/0131685 | A1 | 6/2006 | Watanabe | |
| 2006/0246642 | A1 | 11/2006 | Veeramma | |
| 2008/0265277 | A1 * | 10/2008 | Hirler | H10D 8/411 257/E29.328 |
| 2011/0204469 | A1 | 8/2011 | Onishi | |
| 2011/0291241 | A1 | 12/2011 | Yoshikawa | |
| 2012/0126315 | A1 | 5/2012 | Onishi | |
| 2013/0181328 | A1 * | 7/2013 | Cao | H10D 12/441 257/618 |
| 2017/0040422 | A1 * | 2/2017 | Jung | H10B 43/27 |
| 2020/0395215 | A1 * | 12/2020 | Kubouchi | H10D 12/038 |
| 2021/0082702 | A1 | 3/2021 | Agata | |

FOREIGN PATENT DOCUMENTS

| | | | |
|---|---|---|---|
| JP | S5976466 | A | 5/1984 |
| JP | H0697469 | A | 4/1994 |
| JP | H08306937 | A | 11/1996 |
| JP | 2000243978 | A | 9/2000 |
| JP | 2001111034 | A | 4/2001 |
| JP | 2006173437 | A | 6/2006 |
| JP | 2008193043 | A | 8/2008 |
| JP | 2009099863 | A * | 5/2009 |
| JP | 2011171552 | A | 9/2011 |
| JP | 2011249580 | A | 12/2011 |
| JP | 2012533167 | A | 12/2012 |
| JP | 2021022656 | A | 2/2021 |
| JP | 2021182614 | A | 11/2021 |
| WO | 2018105310 | A1 | 6/2018 |
| WO | 2020080295 | A1 | 4/2020 |

OTHER PUBLICATIONS

Office Action issued for counterpart German Application No. 112022001956.5, issued by the German Patent and Trademark Office on Dec. 2, 2025.

* cited by examiner

SEMICONDUCTOR DEVICE

The contents of the following patent application(s) are incorporated herein by reference:

NO. 2021-209023 filed in JP on Dec. 23, 2021

NO. PCT/JP2022/047683 filed in WO on Dec. 23, 2022

BACKGROUND

1. Technical Field

The present invention relates to a semiconductor device.

2. Related Art

Conventionally, known is a semiconductor device having an edge termination structure portion including a guard ring (for example, refer to Patent Document 1). In the edge termination structure portion, a dielectric film is provided at an upper surface of a semiconductor substrate.

PRIOR ART DOCUMENT

Patent Document

Patent Document 1: Japanese Patent Application Publication No. H08-306937

DESCRIPTION OF EXEMPLARY EMBODIMENTS

Figure 1:
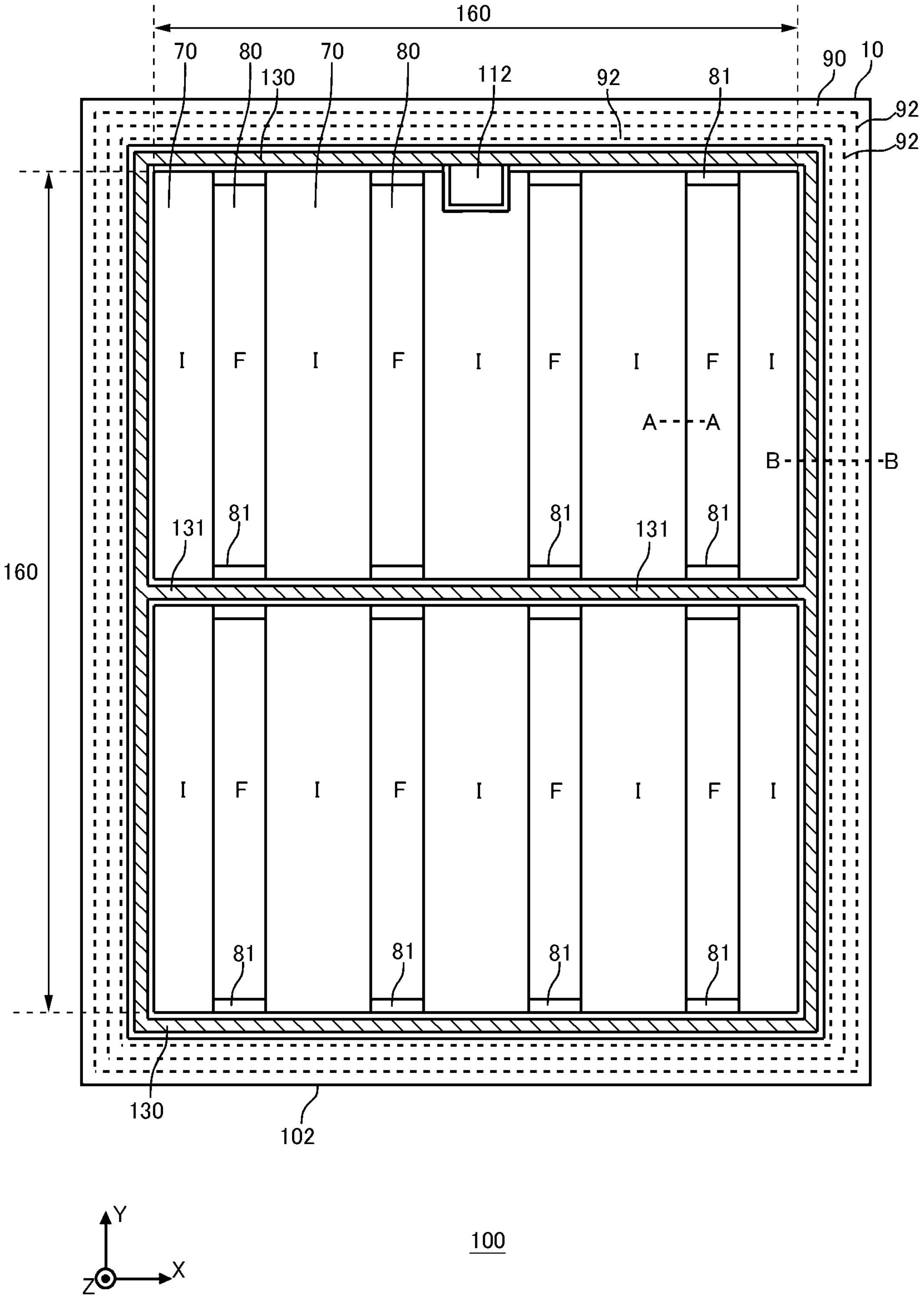
FIG. 1 is an example of a top plan view of a semiconductor device 100.

Hereinafter, the present invention will be described through embodiments of the present invention, but the following embodiments do not limit the present invention according to claims. In addition, not all combinations of features described in the embodiment are essential to the solution of the invention.

Unless otherwise stated, an SI unit system is used as a unit system in the present specification. Although a unit of length may be expressed in cm, calculations may be carried out after conversion to meters (m). In the present specification, one side of a direction parallel to a depth direction of a semiconductor substrate is referred to as "upper", and the other side is referred to as "lower". One surface of two principal surfaces of a substrate, a layer, or another member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes consisting of an X axis, a Y axis, and a Z axis. The orthogonal coordinate axes merely specify relative positions of components, and do not limit a specific direction. For example, the Z axis is not limited to indicate a height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction. When referred to as an upper surface side of the semiconductor substrate in the present specification, the upper surface side indicates a region from the center to the upper surface in the depth direction of the semiconductor substrate. When referred to as a lower surface side of the semiconductor substrate, the lower surface side indicates a region from the center to the lower surface in the depth direction of the semiconductor substrate.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. The N type and the P type are examples of a first conductivity type and a second conductivity type. The N type may be the first conductivity type and the P type may be the second conductivity type, or the P type may be the first conductivity type and the N type may be the second conductivity type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting the conductivity type of the N type, or a semiconductor presenting the conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $|N_D-N_A|$.

The donor has a function of supplying electrons to a semiconductor. The acceptor has a function of receiving the electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies the electrons.

In the present specification, a description of a P+ type or an N+ type means a higher doping concentration than that of the P type or the N type, and a description of a P− type or an N− type means a lower doping concentration than that of the P type or the N type. In addition, in the present specification, a description of a P++ type or an N++ type means a higher doping concentration than that of the P+ type or the N+ type.

A chemical concentration in the present specification indicates an atomic density of the impurity measured regardless of an electrical activation state. The chemical concentration (the atomic density) can be measured by, for example, secondary ion mass spectrometry. The net doping concentration described above can be measured by capacitance-voltage profiling (CV profiling). In addition, a carrier density measured by a spreading resistance method (SRP method) may be used as the net doping concentration. It may be assumed that the carrier density measured by the CV profiling or the SRP method is a value in a thermal equilibrium state. In addition, because, in a region of the N type, the donor concentration is sufficiently greater than the acceptor concentration, the carrier density in the region may be used as the donor concentration. Similarly, the carrier density in a region of the P type may be used as the acceptor concentration in the region.

In addition, when a concentration distribution of the donor, acceptor, or net doping has a peak in a region, a value of the peak may be set as the concentration of the donor, acceptor, or net doping in the region. In a case where the concentration of the donor, acceptor, or net doping is substantially uniform in a region, or the like, an average value of the concentration of the donor, acceptor, or net doping in the region may be set as the concentration of the donor, acceptor, or net doping.

The carrier density measured by the SRP method may be lower than the concentration of a donor or an acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from a carrier density measured by the CV profiling or the SRP method may be lower than a chemical concentration of an element indicating the donor or the acceptor. As an example, in a silicon semiconductor, a donor concentration of phosphorous or arsenic serving as the donor, or an acceptor concentration of boron (boron) serving as an acceptor is approximately 99% of chemical concentrations of these. On the other hand, in the silicon semiconductor, the donor concentration of hydrogen serving as the donor is approximately 0.1% to 10% of a chemical concentration of hydrogen.

FIG. 1 is an example of a top plan view of a semiconductor device 100. FIG. 1 shows a position at which each member is projected at an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. Bulk donors of the N type are distributed throughout the semiconductor substrate 10 of the present example. The bulk donors are donors by dopants contained substantially uniformly in an ingot at the time of manufacturing the ingot that is a source of the semiconductor substrate 10. The bulk donor of the present example is an element other than hydrogen. The bulk donor dopant is, for example, an element of group V or group VI, and is, for example, but not limited to, phosphorous, antimony, arsenic, selenium, or sulfur. The bulk donor of the present example is phosphorous. The bulk donor is also contained in a region of the P type. The semiconductor substrate 10 may be a chip obtained by singulating a wafer cut from a semiconductor ingot. The semiconductor ingot may be manufactured by any of a Czochralski method (CZ method), a magnetic-field applied Czochralski method (MCZ method), or a float zone method (FZ method).

An oxygen chemical concentration contained in the substrate manufactured by the MCZ method is, as an example, $1\times10^{17}$ to $7\times10^{17}$ atoms/cm$^3$. The oxygen chemical concentration contained in the substrate manufactured by the FZ method is, as an example, $1\times10^{15}$ to $5\times10^{16}$ atoms/cm$^3$. A bulk donor concentration may use a chemical concentration of bulk donors distributed throughout the semiconductor substrate 10, and may be a value between 90% and 100% of the chemical concentration. In the semiconductor substrate doped with dopants of group V and group VI such as phosphorous, the bulk donor concentration may be $1\times10^{11}$/cm$^3$ or more and $3\times10^{13}$/cm$^3$ or less. The bulk donor concentration of the semiconductor substrate doped with the dopants of group V and group VI is preferably $1\times10^{12}$/cm$^3$ or more and $1\times10^{13}$/cm 3 or less. In addition, as the semiconductor substrate 10, a non-doped substrate substantially not containing a bulk dopant such as phosphorous may be used. In this case, the bulk donor concentration of the non-doped substrate is, for example, $1\times10^{10}$/cm$^3$ or more and $5\times10^{12}$/cm$^3$ or less. The bulk donor concentration of the non-doped substrate is preferably $1\times10^{11}$/cm$^3$ or more. The bulk donor concentration of the non-doped substrate is preferably $5\times10^{12}$/cm$^3$ or less.

In addition, the bulk acceptors of P type may be distributed throughout the semiconductor substrate 10. The bulk acceptors may be acceptors by dopants contained substantially uniformly in an ingot at the time of manufacturing the ingot that is a source of the semiconductor substrate 10, or may be acceptors implanted into the entire wafer or chip-shaped semiconductor substrate 10. The bulk acceptor may be boron. A bulk acceptor concentration may be lower than the bulk donor concentration. That is, the ingot or the bulk of the semiconductor substrate 10 is N type. As an example, the bulk acceptor concentration is between $5\times10^{11}$ (/cm$^3$) and $8\times10^{14}$ (/cm$^3$), and the bulk donor concentration is between $5\times10^{12}$ (/cm$^3$) and $1\times10^{15}$ (/cm$^3$). The bulk acceptor concentration may be 1% or more, may be 10% or more, or may be 50% or more of the bulk donor concentration. The bulk acceptor concentration may be 99% or less, may be 95% or less, or may be 90% or less of the bulk donor concentration. For the bulk acceptor concentration and the bulk donor concentration, the chemical concentration of the impurities such as boron, phosphorous, or the like distributed throughout the semiconductor substrate 10 may be used. For the bulk acceptor concentration and the bulk donor concentration, a value at the center in the depth direction of the semiconductor substrate 10, of the chemical concentration of the impurities such as boron, phosphorous, or the like distributed throughout the semiconductor substrate 10 may be used.

The semiconductor substrate 10 has an upper surface and a lower surface. The upper surface and the lower surface are two principal surfaces of the semiconductor substrate 10. The semiconductor substrate 10 has an end side 102 in a top view. When merely referred to as the top view in the present specification, it means that the semiconductor substrate 10 is viewed from an upper surface side. The semiconductor substrate 10 of the present example includes two sets of end sides 102 facing each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and the lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, or a diode portion 80 including a diode element such as a free wheeling diode (FWD). In the example in FIG. 1, the transistor portion 70 and the diode portion 80 are alternately arranged along a predetermined array direction (the X axis direction in the present example) at the upper surface of the semiconductor substrate 10. The active portion 160 in another example may be provided with only one of the transistor portion 70 and the diode portion 80.

In FIG. 1, a region where each of the transistor portions 70 is arranged is represented by a symbol "I", and a region where each of the diode portions 80 is arranged is represented by a symbol F. In the present specification, a direction perpendicular to the array direction in the top view may be referred to as an extension direction (the Y axis direction in FIG. 1). Each of the transistor portions 70 and the diode portions 80 may have a longitudinal length in the extension direction. In other words, a length of each of the transistor portions 70 in the Y axis direction is greater than a width in the X axis direction. Similarly, a length of each of the diode portions 80 in the Y axis direction is greater than a width in the X axis direction. The extension directions of the transistor portion 70 and the diode portion 80, and a longitudinal direction of each trench portion described below may be the same.

Each of the diode portions 80 includes a cathode region of the N+ type in a region in contact with the lower surface of the semiconductor substrate 10. In the present specification, a region where the cathode region is provided is referred to as the diode portion 80. In other words, the diode portion 80 is a region that overlaps the cathode region in the top view. On the lower surface of the semiconductor substrate 10, a collector region of a P+ type may be provided in a region other than the cathode region. In the present specification, the diode portion 80 may also include an extension region 81 where the diode portion 80 extends to a gate runner to be described below in the Y axis direction. The collector region is provided on a lower surface of the extension region 81.

The transistor portion 70 has the collector region of the P+ type in a region in contact with the lower surface of the semiconductor substrate 10. In addition, in the transistor portion 70, an emitter region of the N+ type, a base region of the P− type, and a gate structure having a gate conductive portion and a gate dielectric film are periodically arranged in the upper surface side of the semiconductor substrate 10.

The semiconductor device 100 may have one or more pads above the semiconductor substrate 10. The semiconductor device 100 of the present example includes a gate pad 112. The semiconductor device 100 may have an anode pad and a cathode pad connected to a temperature detection diode, and may have a current detection pad. Each pad is arranged in a vicinity of the end side 102. The vicinity of the end side 102 refers to a region between the end side 102 and the emitter electrode in the top view. When the semiconductor device 100 is mounted, each pad may be connected to an external circuit via wiring such as a wire.

A gate potential is applied to the gate pad 112. The gate pad 112 is electrically connected to a conductive portion of a gate trench portion of the active portion 160. The semiconductor device 100 includes a gate runner to connect the gate pad 112 and the gate trench portion. In FIG. 1, the gate runner is hatched with diagonal lines.

The gate runner of the present example includes an outer circumferential gate runner 130 and an active side gate runner 131. The outer circumferential gate runner 130 is arranged between the active portion 160 and the end side 102 of the semiconductor substrate 10 in the top view. The outer circumferential gate runner 130 of the present example encloses the active portion 160 in the top view. A region enclosed by the outer circumferential gate runner 130 in the top view may be the active portion 160. In addition, the outer circumferential gate runner 130 is connected to the gate pad 112. The outer circumferential gate runner 130 is arranged above the semiconductor substrate 10. The gate runner may be a metal wiring including aluminum or the like, may be a wiring formed of polysilicon, or may also be a stacked wiring where these wirings are stacked.

The active side gate runner 131 is provided in the active portion 160. With the provision of the active side gate runner 131 in the active portion 160, it is possible to reduce a variation in wiring length from the gate pad 112 in each region of the semiconductor substrate 10.

The active side gate runner 131 is connected to the gate trench portion of the active portion 160. The active side gate runner 131 is arranged above the semiconductor substrate 10. The active side gate runner 131 may be a wiring formed of a semiconductor such as polysilicon doped with the impurity.

The active side gate runner 131 may be connected to the outer circumferential gate runner 130. The active side gate runner 131 of the present example is provided to extend in the X axis direction so as to cross the active portion 160 from one outer circumferential gate runner 130 to the other outer circumferential gate runner 130, substantially at the center of the Y axis direction. When the active portion 160 is divided by the active side gate runner 131, the transistor portion 70 and the diode portion 80 may be alternately arranged in the X axis direction in each of the divided regions.

In addition, the semiconductor device 100 may include a temperature sensing portion (not shown) which is a PN junction diode formed of polysilicon or the like, and a current detection portion (not shown) which simulates an operation of the transistor portion provided in the active portion 160.

The semiconductor device 100 of the present example includes an edge termination structure portion 90 between the active portion 160 and the end side 102. The edge termination structure portion 90 is provided on an outside of the active portion 160 on the semiconductor substrate 10. The description "outside" for the semiconductor substrate 10 refers to a side closer to the end side 102. The edge termination structure portion 90 of the present example is arranged between the outer circumferential gate runner 130 and the end side 102. The edge termination structure portion 90 relaxes an electric field concentration in the upper surface side of the semiconductor substrate 10. The edge termination structure portion 90 includes a plurality of guard rings 92. The guard ring 92 is a region of the P+ type in contact with the upper surface of the semiconductor substrate 10. The guard ring 92 may enclose the active portion 160 in the top view. The plurality of guard rings 92 are arranged at predetermined intervals between the outer circumferential gate runner 130 and the end side 102. The guard ring 92 arranged on the outside may enclose the guard ring 92 arranged on an inside by one. The outside refers to a side close to the end side 102, and the inside refers to a side close to the center of the semiconductor substrate 10, in the top view. By providing the plurality of guard rings 92, a depletion layer in an upper surface side of the active portion 160 can be extended outward, and a breakdown voltage of the semiconductor device 100 can be improved. The edge termination structure portion 90 may further include at least one of a field plate or a RESURF annularly provided to enclose the active portion 160.

Figure 2:
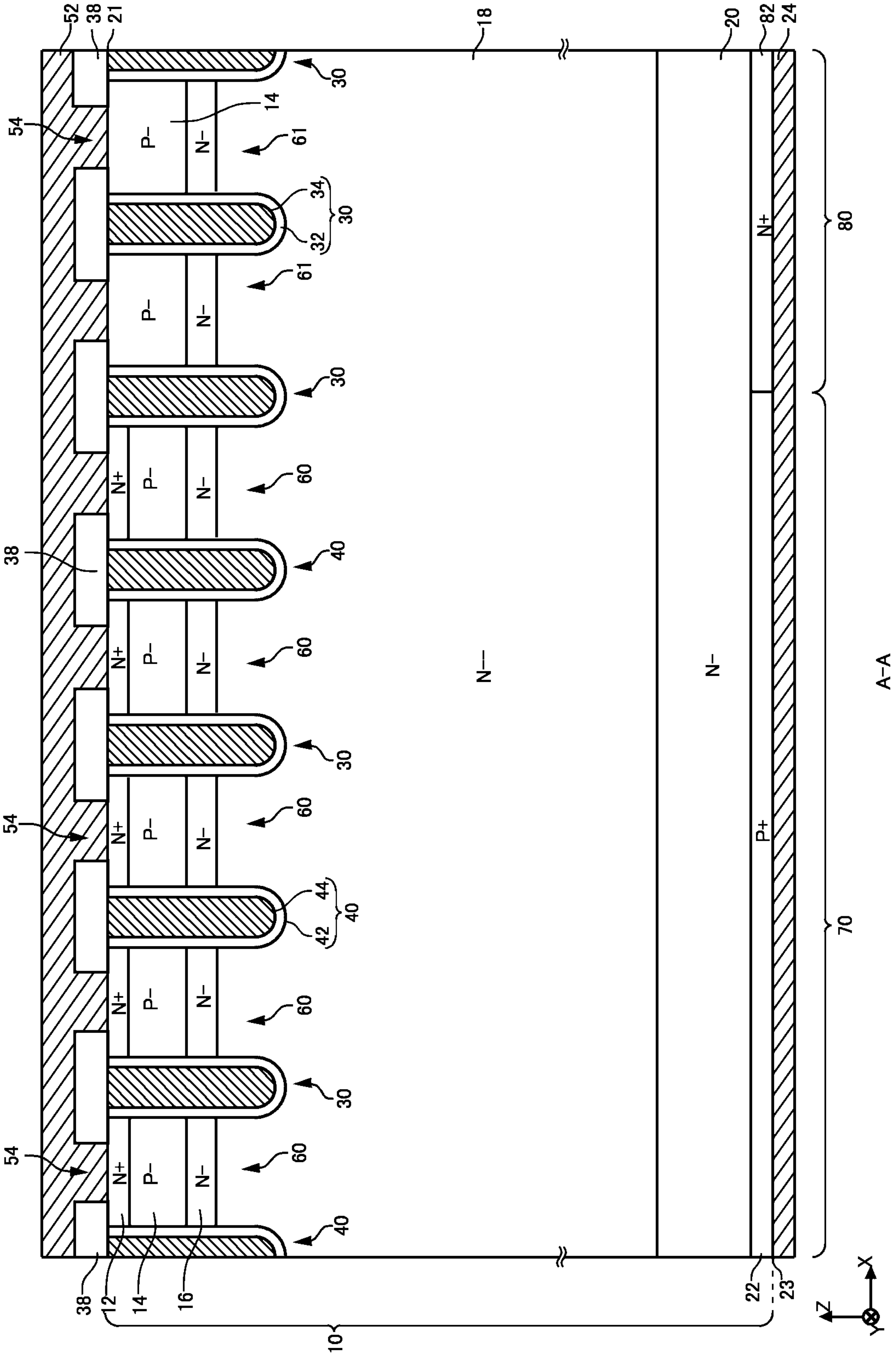
FIG. 2 is a diagram showing an example of a cross section taken along A-A in FIG. 1.

FIG. 2 is a diagram showing an example of a cross section taken along A-A in FIG. 1. The cross section taken along A-A is an XZ plane passing through the transistor portion 70 and the diode portion 80. The semiconductor device 100 of the present example includes the semiconductor substrate 10, an interlayer dielectric film 38, an emitter electrode 52, and a collector electrode 24 in the cross section. The interlayer dielectric film 38 is provided on an upper surface 21 of the semiconductor substrate 10. The interlayer dielectric film 38 is a film including at least one layer of a dielectric film such as silicate glass to which the impurities of boron, phosphorous, or the like are added, a thermal oxide film, a nitride film, or another dielectric film. The interlayer dielectric film 38 is provided with a contact hole 54 for connecting the emitter electrode 52 and the semiconductor substrate 10 to each other.

The emitter electrode 52 is provided above the interlayer dielectric film 38. The emitter electrode 52 is in contact with the upper surface 21 of the semiconductor substrate 10 through the contact hole 54 of the interlayer dielectric film 38. The emitter electrode 52 may be in contact with an emitter region 12, a contact region, and a base region 14, which will be described below. The collector electrode 24 is provided on a lower surface 23 of the semiconductor substrate 10. The emitter electrode 52 and the collector electrode 24 are formed of a metal material such as aluminum. In the present specification, a direction in which the emitter electrode 52 is connected to the collector electrode 24 (the Z axis direction) is referred to as the depth direction.

The semiconductor substrate 10 has a drift region 18 of an N−− type. The doping concentration in the drift region 18 may be the same as the bulk donor concentration or may be the same as a bulk net doping concentration, which is a difference between the bulk donor concentration and the bulk acceptor concentration. In another example, the doping concentration in the drift region 18 may be higher than the bulk donor concentration or the bulk net doping concentration. The drift region 18 is provided in each of the transistor portion 70 and the diode portion 80.

One or more gate trench portions 40 and dummy trench portions 30 are provided in the upper surface side of the semiconductor substrate 10. The gate trench portion 40 functions as a gate electrode with a gate voltage being applied thereto, and the dummy trench portion 30 does not function as the gate electrode without the gate voltage being applied thereto. In the present specification, the gate trench portion 40 and the dummy trench portion 30 may be referred to as a trench portion. The trench portion is provided in the depth direction from the upper surface 21 of the semiconductor substrate 10 to the drift region 18. In addition, the trench portion is extended in the extension direction (the Y axis direction) at the upper surface 21 of the semiconductor substrate 10.

Each of the transistor portion 70 and the diode portion 80 includes a plurality of trench portions arranged in the array direction. In the transistor portion 70 of the present example, one or more gate trench portions 40 and one or more dummy trench portions 30 are alternately provided along the array direction. In the diode portion 80 of the present example, the plurality of dummy trench portions 30 are provided along the array direction. In the diode portion 80 of the present example, the gate trench portion 40 is not provided.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. A depth position of a lower end of the mesa portion is the same as a depth position of a lower end of the trench portion. The mesa portion of the present example is provided so as to extend in the extension direction (the Y axis direction) along the trench, at the upper surface of the semiconductor substrate 10. In the present example, a mesa portion 60 is provided in the transistor portion 70, and a mesa portion 61 is provided in the diode portion 80. As simply used in the present specification, unless otherwise specified, the "mesa portion" refers to each of the mesa portion 60 and the mesa portion 61.

In the mesa portion 60 of the transistor portion 70, the emitter region 12 of the N+ type of and the base region 14 of the P− type are provided in order from an upper surface 21 side of the semiconductor substrate 10. The drift region 18 is provided below the base region 14. The mesa portion 60 may be provided with an accumulation region 16 of the N− type. The accumulation region 16 is arranged between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than that of the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is a region of the N− type with a higher doping concentration than that of the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover an entire lower surface of the base region 14 in each mesa portion 60.

The mesa portion 61 of the diode portion 80 is provided with the base region 14 of the P− type in contact with the upper surface 21 of the semiconductor substrate 10. The drift region 18 is provided below the base region 14. In the mesa portion 61, the accumulation region 16 may be provided below the base region 14.

At least one of the mesa portion 60 or the mesa portion 61 may be provided with the contact region of the P+ type exposed to the upper surface 21 of the semiconductor substrate 10. For example, in the mesa portion 60, the contact region and the emitter region 12 may be alternately arranged along the Y axis direction.

In each of the transistor portion 70 and the diode portion 80, a buffer region 20 of the N-type may be provided to be closer to a lower surface 23 side than the drift region 18. The doping concentration of the buffer region 20 is higher than the doping concentration of the drift region 18. The buffer region 20 has one or a plurality of donor concentration peaks having a higher donor concentration than the donor concentration of the drift region 18. The buffer region 20 may function as a field stopper layer which prevents a depletion layer expanding from a lower end of the base region 14 from reaching a collector region 22 of the P+ type and a cathode region 82 of the N+ type.

In the transistor portion 70, the collector region 22 of the P+ type is provided below the buffer region 20. The acceptor concentration of the collector region 22 is higher than the acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. The donor concentration of the cathode region 82 is higher than the donor concentration of the drift region 18. The donor of the cathode region 82 is, for example, hydrogen or phosphorous. Note that an element serving as the donor and the acceptor in each region is not limited to the example described above. The collector region 22 and the cathode region 82 are exposed to the lower surface 23 of the semiconductor substrate 10, and are connected to the collector electrode 24. The collector electrode 24 may be in contact with the entire lower surface 23 of the semiconductor substrate 10. The emitter electrode 52 and the collector electrode 24 are formed of a metal material such as aluminum.

Each trench portion passes through the base region 14 from the upper surface 21 of the semiconductor substrate 10, and reaches the drift region 18. In a region where at least any of the emitter region 12, the contact region, or the accumulation region 16 is provided, each trench portion also passes through these doping regions and reaches the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

As described above, the transistor portion 70 is provided with the gate trench portion 40 and the dummy trench portion 30. In the diode portion 80, the dummy trench portion 30 is provided, and the gate trench portion 40 is not provided. A boundary in the X axis direction between the diode portion 80 and the transistor portion 70 in the present example is a boundary between the cathode region 82 and the collector region 22.

The gate trench portion 40 includes a gate trench with a groove shape, a gate dielectric film 42, and a gate conductive portion 44 that are provided at the upper surface 21 of the semiconductor substrate 10. The gate trench portion 40 is an example of a gate structure. The gate dielectric film 42 is provided to cover an inner wall of the gate trench. The gate dielectric film 42 may be formed by oxidizing or nitriding a semiconductor on the inner wall of the gate trench. The gate conductive portion 44 is provided on an inside of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 at the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at an interface in contact with the gate trench portion 40.

The dummy trench portion 30 may have the same structure as that of the gate trench portion 40 in the cross section. The dummy trench portion 30 includes a dummy trench, a dummy dielectric film 32, and a dummy conductive portion 34 that are provided at the upper surface 21 of the semiconductor substrate 10. The dummy conductive portion 34 may be connected to an electrode different from the gate pad. For example, the dummy conductive portion 34 may be connected to a dummy pad (not shown) connected to an external circuit different from the gate pad, and a control different from that of the gate conductive portion 44 may be performed. In addition, the dummy conductive portion 34 may be electrically connected to the emitter electrode 52. The dummy dielectric film 32 is provided to cover an inner wall of the dummy trench. The dummy conductive portion 34 is provided inside the dummy trench, and is provided on an inside of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as that of the gate conductive portion 44 in the depth direction.

In the cross section, the gate trench portion 40 and the dummy trench portion 30 are covered with the interlayer dielectric film 38 at the upper surface 21 of the semiconductor substrate 10. As described above, the gate trench portion 40 may be connected to the gate runner at any location, and the dummy trench portion 30 may be connected to the emitter electrode 52 at any location.

Figure 3:
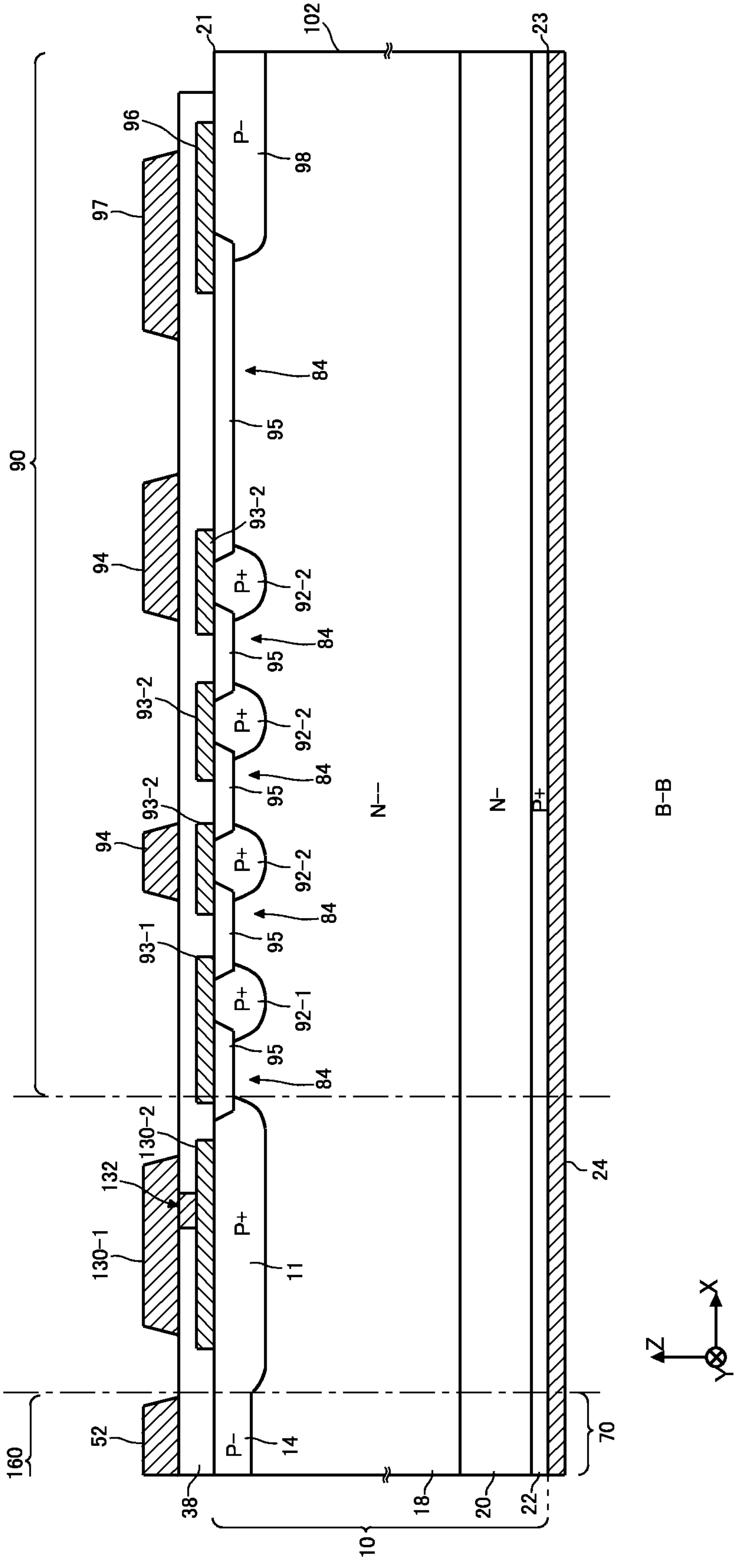
FIG. 3 is a diagram showing an example of a cross section taken along B-B in FIG. 1.

FIG. 3 is a diagram showing an example of a cross section taken along B-B in FIG. 1. The cross section taken along B-B is the XZ plane passing through the outer circumferential gate runner 130 and the edge termination structure portion 90. In FIG. 3, a part of the transistor portion 70 in a vicinity of the outer circumferential gate runner 130 is also shown.

The outer circumferential gate runner 130 is arranged above the upper surface 21 of the semiconductor substrate 10. In the present example, an outer circumferential gate runner 130-1 and an outer circumferential gate runner 130-2 are stacked and arranged in the Z axis direction. The outer circumferential gate runner 130-1 is formed of a metal material such as aluminum, and the outer circumferential gate runner 130-2 is formed of polysilicon to which the impurities are added.

Note that the outer circumferential gate runner 130-2 and the semiconductor substrate 10 are insulated by the dielectric film such as a thermal oxide film, which is omitted in FIG. 3. The outer circumferential gate runner 130-2 is connected to the gate conductive portion 44 at any position.

The outer circumferential gate runner 130-1 is arranged above the outer circumferential gate runner 130-2. The interlayer dielectric film 38 is arranged between the outer circumferential gate runner 130-1 and the outer circumferential gate runner 130-2. The interlayer dielectric film 38 is provided with a contact hole 132 for connecting the outer circumferential gate runner 130-1 and the outer circumferential gate runner 130-2. The contact hole 132 may be provided to enclose the active portion 160 along the outer circumferential gate runner 130. The outer circumferential gate runner 130-1 is connected to the outer circumferential gate runner 130-2 through the contact hole 132.

A well region 11 is provided in the semiconductor substrate 10 below the outer circumferential gate runner 130. The well region 11 is provided from the upper surface 21 of the semiconductor substrate 10 to a position deeper than the base region 14. The well region 11 is exposed to the upper surface 21. In the present specification, a case of describing that a predetermined region is exposed to the upper surface 21, includes a case where the region is exposed to a bottom surface of a groove formed at the upper surface 21, in addition to a case where the region is exposed to the upper surface 21. The region exposed to the upper surface 21 is in contact with a member different from the semiconductor substrate of an insulating member, a conductive member, or the like.

It is preferable to provide the well region 11 to be deeper than the trench portion (refer to FIG. 2). The well region 11 is a region of the P+ type having a higher concentration than that of the base region 14. The interlayer dielectric film 38 may be formed between the emitter electrode 52 and the well region 11. The well region 11 may be connected to the emitter electrode 52 via one or more contact holes formed in the interlayer dielectric film 38. That is, the well region 11 may be electrically connected to the emitter electrode 52.

The well region 11 is provided to overlap the outer circumferential gate runner 130. The well region 11 may be provided to extend with a predetermined width even in a range that does not overlap the outer circumferential gate runner 130. In addition, the well region 11 may be provided to enclose the active portion 160 along the outer circumferential gate runner 130. The well region 11 may also be arranged below the active side gate runner 131. By providing the well region 11, a depletion layer expanding from the active portion 160 can be easily extended to the edge termination structure portion 90, so that breaking in the active portion 160 can be suppressed.

A well plate formed of a conductive member is provided above the well region 11. The outer circumferential gate runner 130 is an example of the well plate. The well plate may be insulated from the well region 11 like the outer circumferential gate runner 130, or may be electrically connected to the well region 11.

In the present example, the region which is enclosed by the well region 11 is set as the active portion 160. In addition, a region on an outside of the well region 11 is set as the edge termination structure portion 90. The well region 11 may be connected to the base region 14 of the active portion 160.

The edge termination structure portion 90 has one or more guard rings 92, one or more first conductivity type regions 84, and one or more field plates 93. The edge termination structure portion 90 of the present example further has a plurality of dielectric films 95, a plurality of field electrodes 94, an outer electrode 97, an outer plate 96 and a channel stopper 98.

The guard ring 92 is a region of the P+ type provided in contact with the upper surface 21 of the semiconductor substrate 10. One or more guard rings 92 are provided between the well region 11 and the end side 102 of the semiconductor substrate 10, and exposed to the upper surface 21 of the semiconductor substrate 10. Among the one or more guard rings 92, the guard ring 92 closest to the well region 11 is set as a first guard ring 92-1. In addition, among the one or more guard rings 92, the guard ring 92 other than the first guard ring 92-1 is set as a second guard ring 92-2. The edge termination structure portion 90 may be provided with one or more second guard rings 92-2. References herein to the guard ring 92 in the present specification refers to each of the first guard ring 92-1 and the second guard ring 92-2.

As shown in FIG. 1, each of the guard rings 92 encloses the active portion 160. A lower end of the guard ring 92 may be arranged to be closer to the lower surface 23 side than the lower end of the base region 14. The lower end of the guard ring 92 may be arranged to be closer to the lower surface 23 side than the lower end of the trench portion (refer to FIG. 2). The lower end of the guard ring 92 may be arranged to be closer to the lower surface 23 side than a lower end of the well region 11, may be arranged to be closer to the upper surface 21 side than the lower end of the well region 11, or may be arranged at the same depth position as that of the lower end of the well region 11. In the present example, the lower end of the guard ring 92 is arranged at the same depth position as that of the lower end of the well region 11.

The first conductivity type region 84 is a region of the first conductivity type provided between the first guard ring 92-1 and the well region 11. The first conductivity type region 84 may be exposed to the upper surface 21 of the semiconductor substrate 10. The first conductivity type region 84 of the present example is the drift region 18; however, the first conductivity type region 84 may have the same concentration as that of the drift region 18, may be a region with a higher concentration than that of the drift region 18, or may be a region with a lower concentration than that of the drift region 18. The first conductivity type region 84 may also be provided between two guard rings 92 that are adjacent to each other in the top view. In the present example, the first conductivity type region 84 is provided between the respective guard rings 92. The first conductivity type region 84 may also be provided between the second guard ring 92-2 and the channel stopper 98.

The dielectric film 95 is provided to cover each first conductivity type region 84. In the present example, the dielectric films 95 are provided to cover the first conductivity type regions 84 between the first guard ring 92-1 and the well region 11, between two guard rings 92 that are adjacent to each other, and between the second guard ring 92-2 and the channel stopper 98. The dielectric film 95 may be provided along the guard ring 92 to enclose the active portion 160.

At least a part of the dielectric film 95 of the present example is embedded inside the semiconductor substrate 10. That is, at least a part of the dielectric film 95 is arranged below the upper surface 21 of the semiconductor substrate 10. The upper surface 21 of the semiconductor substrate 10 may refer to a surface on an uppermost side among surfaces of a semiconductor material such as silicon. In the dielectric film 95, a thickness of a part below the upper surface 21 of the semiconductor substrate 10 may be greater than a thickness of a part above the upper surface 21. The entire dielectric film 95 may be provided at the same position as or below that of the upper surface 21 of the semiconductor substrate 10. An upper surface of the dielectric film 95 in the present example is at the same position as that of the upper surface 21 of the semiconductor substrate 10, and the entire dielectric film 95 is provided below the upper surface 21 from the same position as that of the upper surface 21 of the semiconductor substrate 10.

The dielectric film 95 may have a dielectric film obtained by oxidizing or nitriding the semiconductor substrate 10, may have a dielectric film deposited by CVD or the like, or may have another dielectric film. The dielectric film 95 may be a single layer dielectric film, or may be a dielectric film in which a plurality of films formed by different methods are stacked. The dielectric film 95 of the present example is a LOCOS film formed, by forming a recess at the upper surface 21 of the semiconductor substrate 10 and thermally oxidizing a semiconductor material exposed to the recess.

By providing the dielectric film 95, it is possible to prevent the semiconductor substrate 10 from being exposed between the guard rings 92. That is, it is possible to prevent the semiconductor substrate 10 between the guard rings 92 from coming into contact with a conductive member. In addition, by arranging at least a part of the dielectric film 95 inside the semiconductor substrate 10, it is possible to reduce unevenness at the upper surface 21 of the semiconductor substrate 10. This makes it easier to form a member to be arranged above the upper surface 21 of the semiconductor substrate 10. For example, since a step of the field plate 93 can be reduced, it is easy to form the field plate 93.

The field plate 93 is a conductive member provided above the upper surface 21 of the semiconductor substrate 10. The field plate 93 of the present example is formed of polysilicon to which the impurities are added. The field plate 93 is arranged above the guard ring 92. In the present example, the field plates 93 are provided for all of the guard rings 92. Each field plate 93 is electrically connected to the corresponding guard ring 92. Each field plate 93 may be in direct contact with the corresponding guard ring 92, or may be electrically connected via the corresponding field electrode 94.

Each field plate 93 is provided along the corresponding guard ring 92 to enclose the active portion 160 in the top view. The field plate 93 is arranged to cover at least a part of the corresponding guard ring 92. At least one field plate 93 may be arranged to cover the entire corresponding guard ring 92. At least one field plate 93 may be provided to extend to a position that does not overlap the corresponding guard ring 92. A dielectric film such as a thermal oxide film may be provided between the field plate 93 and the semiconductor substrate 10 (or the dielectric film 95).

Among one or more field plates 93, the field plate 93 connected to the first guard ring 92-1 is set as a first field plate 93-1. In addition, among the one or more field plates 93, the field plate 93 other than the first field plate 93-1 is set as a second field plate 93-2. The edge termination structure portion 90 may be provided with one or more second field plates 93-2. References herein to the field plate 93 in the present specification refers to each of the first field plate 93-1 and the second field plate 93-2.

In the present example, the field electrode 94 is formed of a metal material such as aluminum. The field electrode 94 is arranged above the field plate 93. The field electrode 94 is provided for at least one field plate 93. The field electrode 94 may be provided for all of the field plates 93 one by one.

The interlayer dielectric film 38 is arranged between the field electrode 94 and the field plate 93. The interlayer dielectric film 38 is also provided between the outer circumferential gate runner 130-2 and the first field plate 93-1, between the two field plates 93, and between the second field plate 93-2 and the outer plate 96. The interlayer dielectric film 38 may be connected to the dielectric film 95.

The field electrode 94 and the field plate 93 are connected to each other via a contact hole provided in the interlayer dielectric film 38. The cross section shown in FIG. 3 does not show the contact hole; however, in another cross section, the contact hole is provided in the interlayer dielectric film 38. As an example, the contact holes may be provided in four corners of the semiconductor substrate 10 in the edge termination structure portion 90, and the field electrode 94 and the field plate 93 may be connected to each other via the contact hole. The field electrode 94 and the field plate 93 can be electrically connected to each other by these, and be set to have the same potential. In addition, the contact hole connecting the field electrode 94 and the guard ring 92 may be provided in the interlayer dielectric film 38. Each field electrode 94 is electrically floating. For example, when a voltage $V_{CE}$ is applied to the collector electrode 24 in a state in which a gate of the semiconductor device 100 is off, a predetermined voltage lower than the voltage $V_{CE}$ is applied to each field electrode 94.

The channel stopper 98 is provided in contact with the end side 102 and the upper surface 21 of the semiconductor substrate 10. The channel stopper 98 is the P type having a concentration equal to or higher than that of the base region 14, or is the N type having a higher concentration than that of the drift region 18. The outer plate 96 is arranged above the channel stopper 98 and is electrically connected to the channel stopper 98. The outer plate 96 is formed of polysilicon to which the impurities are added. The outer plate 96 and the channel stopper 98 may be provided on a dielectric film (not shown), may be connected to each other via the contact hole provided in the dielectric film, or may be in direct contact with each other. The channel stopper 98 may be connected to the outer electrode 97 via the contact hole.

The outer electrode 97 is arranged above the outer plate 96. The outer electrode 97 is formed of a metal material such as aluminum. The interlayer dielectric film 38 is provided between the outer electrode 97 and the outer plate 96. The outer electrode 97 and the outer plate 96 are connected via the contact hole provided in the interlayer dielectric film 38. The contact hole may be provided in a vicinity of a corner portion of the semiconductor substrate 10. A predetermined voltage is applied to the outer electrode 97. A potential of the channel stopper 98 is a potential of the collector electrode 24. By setting the potential of the channel stopper 98 to the potential of the collector electrode 24, expansion of the depletion layer extending from the active portion 160 is suppressed by the outer electrode 97 and is prevented from reaching a side surface of the semiconductor substrate 10. This improves the breakdown voltage of the semiconductor device 100. Note that the outer plate 96 may also be omitted. In this case, the channel stopper 98 is connected to the outer electrode 97 via the contact hole provided in the interlayer dielectric film 38.

Note that in addition to the configuration described with reference to FIG. 3, the semiconductor device 100 may include a protective member formed of gel or resin. The protective member may be formed of polyimide. The protective member covers at least a part of a periphery of the semiconductor substrate 10. For example, the interlayer dielectric film 38, the field electrode 94, and the outer electrode 97 provided at the upper surface 21 of the edge termination structure portion 90 are covered with the protective member.

Figure 4:
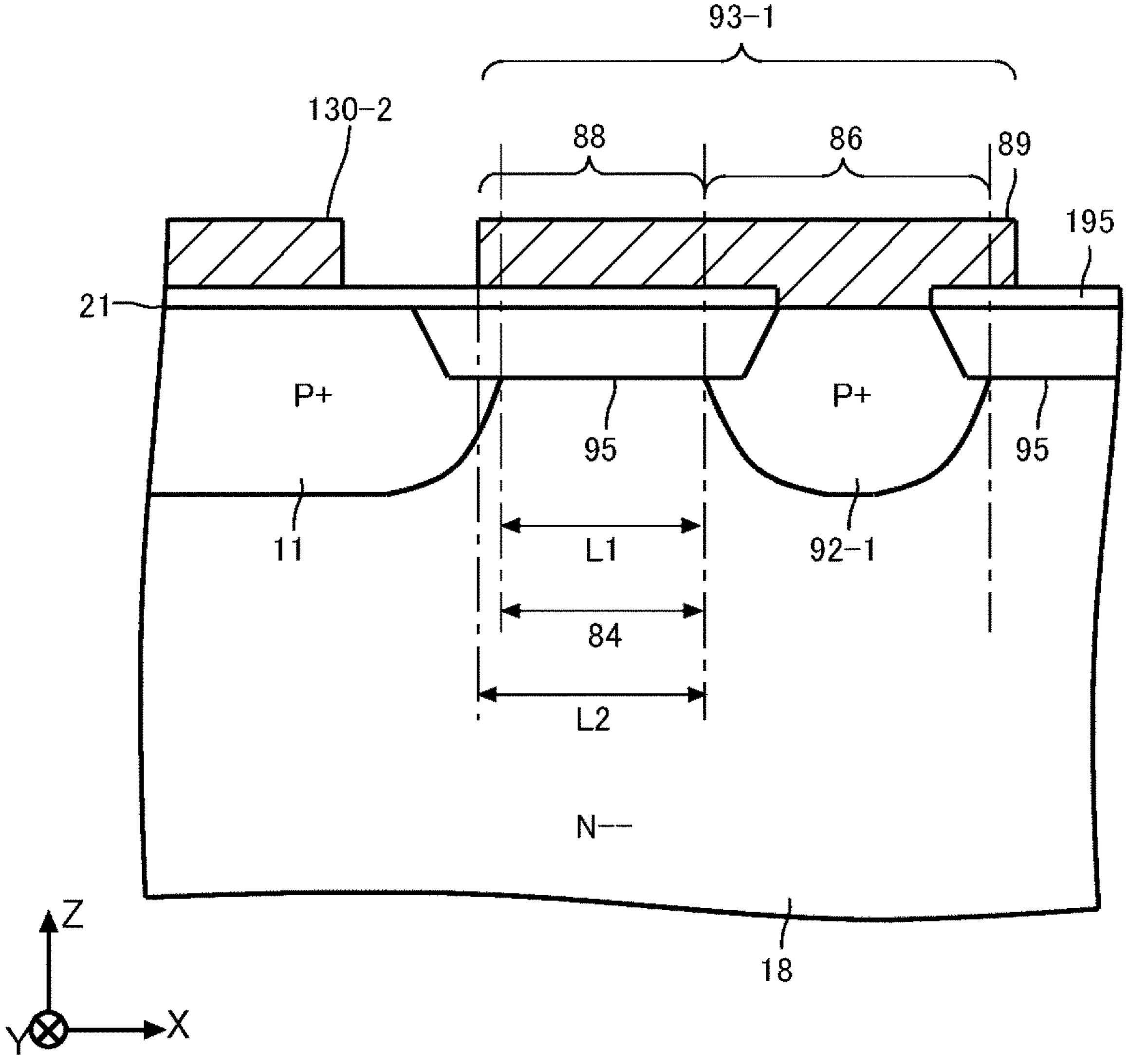
FIG. 4 is an enlarged diagram of a well region 11 and a vicinity of the first guard ring 92-1.

FIG. 4 is an enlarged diagram of a well region 11 and a vicinity of the first guard ring 92-1. FIG. 4 also shows a dielectric film 195 omitted in FIG. 3. The dielectric film 195 of the present example is a thermal oxide film formed at the upper surface 21 of the semiconductor substrate 10 and the dielectric film 95. In FIG. 4, the interlayer dielectric film 38 or the like is omitted.

The well region 11 and the first guard ring 92-1 of the present example are provided to a position below the dielectric film 95. That is, end portions of the well region 11 and the first guard ring 92-1 in the X axis direction overlap the dielectric film 95 below the dielectric film 95. The first conductivity type region 84 is provided in a portion sandwiched between the well region 11 and the first guard ring 92-1 in the top view. A length of the first conductivity type region 84 is set as L1. The length L1 may be a length of the first conductivity type region 84 at a position in contact with the dielectric film 95. The length L1 may be a shortest distance between the well region 11 and the first guard ring 92-1 in the top view.

The first field plate 93-1 has an upper portion 86, an inner extension portion 88, and an outer extension portion 89. The upper portion 86, the inner extension portion 88, and the outer extension portion 89 of the present example are formed of the same material. The upper portion 86 is a portion that is arranged above the first guard ring 92-1 and overlaps the first guard ring 92-1 in the top view. The upper portion 86 may be connected to the first guard ring 92-1. The upper portion 86 of the present example is connected to the first guard ring 92-1 via a contact hole provided in the dielectric film 195.

The outer extension portion 89 is a portion that extends from the upper portion 86 in a direction of an opposite side of the well region 11 in the top view. That is, the outer extension portion 89 is a portion that extends from the upper portion 86 toward the end side 102 of the semiconductor substrate 10. The first guard ring 92-1 may not have the outer extension portion 89.

The inner extension portion 88 is provided to extend in a direction from the upper portion 86 to the well region 11 in the top view. FIG. 4 shows the inner extension portion 88 that extends from the upper portion 86 in a direction parallel to the X axis. The dielectric film 95 and the dielectric film 195 are provided between the inner extension portion 88 and the semiconductor substrate 10. A length of the inner extension portion 88 in the top view is set as L2. The length L2 is a length in the same direction as that of the length L1.

The inner extension portion 88 is provided to overlap 90% or more of the first conductivity type region 84 between the first guard ring 92-1 and the well region 11. A ratio of the overlap between the inner extension portion 88 and the first conductivity type region 84 may be a ratio of an area in the top view, or may be a ratio of a length in any cross section. That is, the inner extension portion 88 may cover 90% or more of the area of the first conductivity type region 84 in the top view. Alternatively, the length L2 of the inner extension portion 88 may be 90% or more of the length L1 of the first conductivity type region 84 in any cross section perpendicular to an XY plane.

The ratio of the overlap between the inner extension portion 88 and the first conductivity type region 84 may be 95% or more, or may be 100% or more. The inner extension portion 88 may be provided to a position that overlaps the well region 11 in the top view. The ratio of the overlap between the inner extension portion 88 and the first conductivity type region 84 may be 120% or less, may be 110% or less, or may be 105% or less. By covering most or all of the first conductivity type region 84 with the inner extension portion 88, the breakdown voltage of the semiconductor device 100 can be improved.

Figure 5:
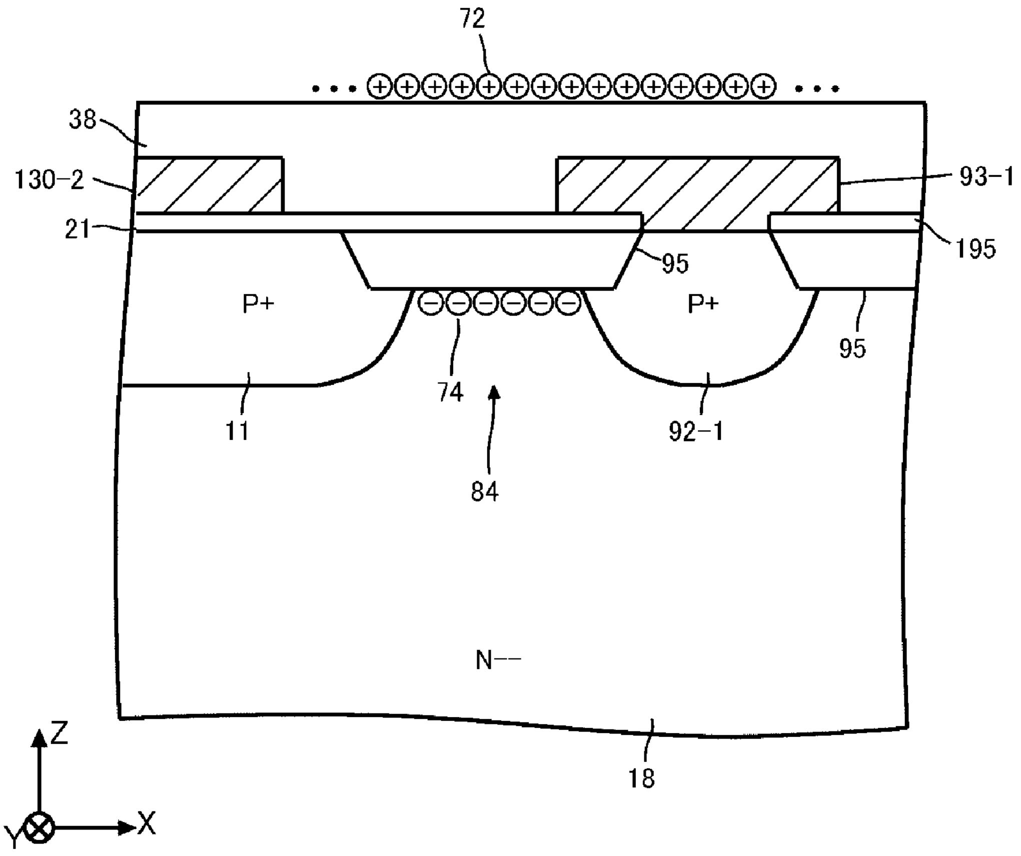
FIG. 5 is a diagram for describing a comparison example.

FIG. 5 is a diagram for describing a comparison example. In the comparison example, the first field plate 93-1 does not cover most or all of the first conductivity type region 84. When the semiconductor device 100 is used, a charge 72 may be accumulated in an upper surface of the interlayer dielectric film 38. The charge 72 of the present example is a positive charge. For example, charged particles such as ions contained in the protective member covering the semiconductor device 100, may aggregate in the edge termination structure portion 90 to which a voltage is applied. Since an electrode of the field plate 93 or the like of the edge termination structure portion 90 is a floating electrode, these charged particles are not extracted via an electrode of the edge termination structure portion 90, and remain in the edge termination structure portion 90. These charged particles pass through the protective member, and are distributed on an interface between the protective member and the interlayer dielectric film 38 (that is, the upper surface of the interlayer dielectric film 38).

When the charge 72 is accumulated at the upper surface of the interlayer dielectric film 38, a charge 74 of the opposite polarity is induced at the upper surface 21 of the semiconductor substrate 10 arranged with a dielectric substance such as a dielectric film interposed therebetween. The charge 74 of the present example is a negative charge. By the charge 74 being induced, a manner in which the depletion layer in the edge termination structure portion 90 extends, may be changed to reduce the breakdown voltage. In particular, when the first conductivity type region 84 with a comparatively low doping concentration, such as drift region 18, is exposed to the upper surface 21 of the semiconductor substrate 10, a ratio of a density of the charge 74 that is induced in an upper surface of the first conductivity type region 84, may become relatively great with respect to the doping concentration of the first conductivity type region 84. Therefore, even a small amount of the charges 74 affect the breakdown voltage. In particular, when the charge 74 is induced in the first conductivity type region 84 between the well region 11 and the first guard ring 92-1, the breakdown voltage is greatly affected.

In contrast with this, in the examples described in FIG. 1 to FIG. 4, the first field plate 93-1 covers 90% or more of the first conductivity type region 84 between the well region 11 and the first guard ring 92-1. Therefore, the induction of the charge 74 in the first conductivity type region 84 can be hindered, and a reduction in breakdown voltage can be suppressed.

Figure 6:
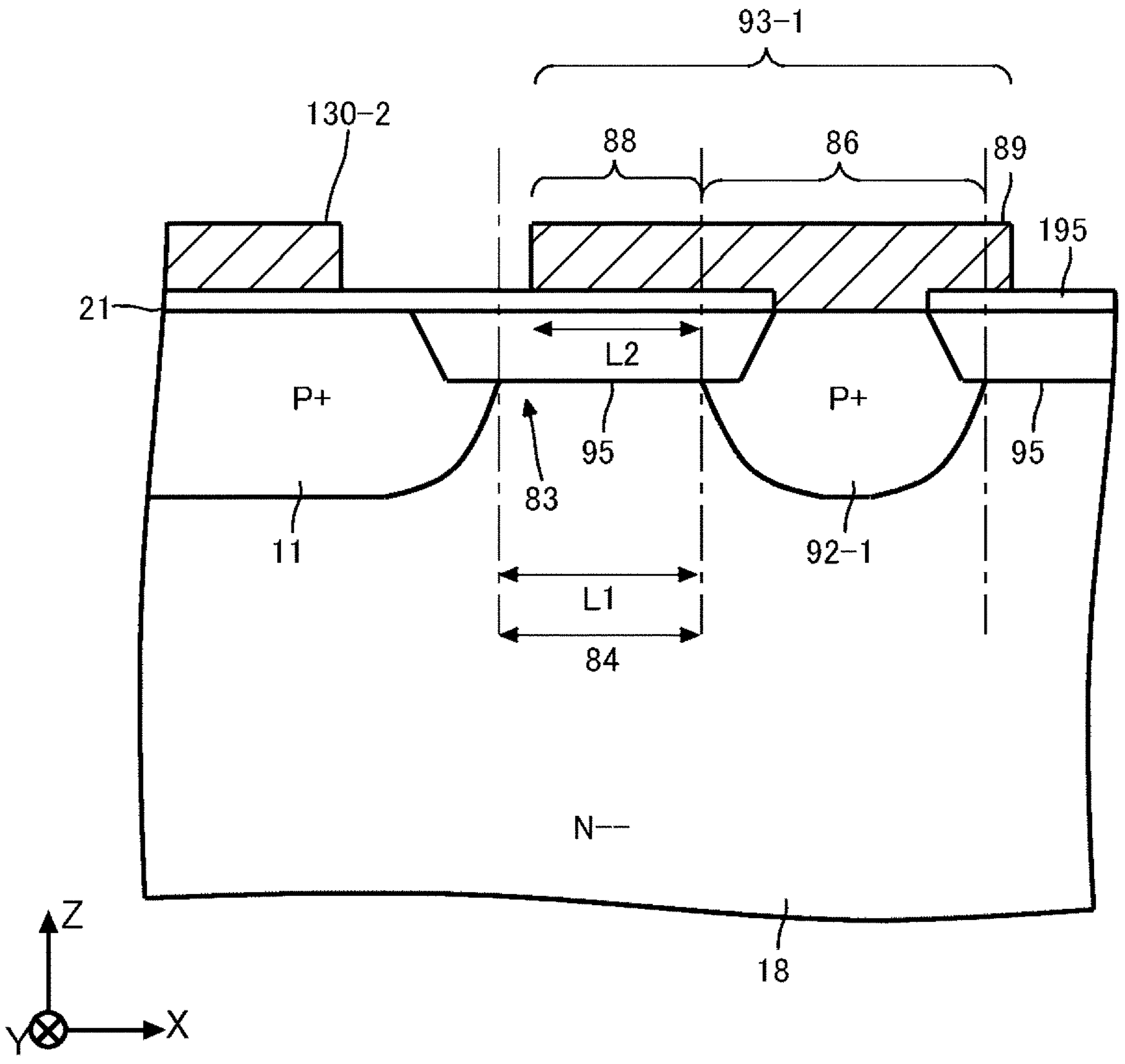
FIG. 6 is a diagram showing another structural example of an inner extension portion 88 of a first field plate 93-1.

FIG. 6 is a diagram showing another structural example of an inner extension portion 88 of a first field plate 93-1. Structures other than the inner extension portion 88 are similar to those of any of the examples described in the present specification and drawing. The inner extension portion 88 of the present example is arranged not to overlap the well region 11. That is, the length L2 of the inner extension portion 88 is smaller than the length L1 of the first conductivity type region 84. Note that as described above, the length L2 is 90% or more of the length L1.

In the example of FIG. 6, the outer circumferential gate runner 130-2 is provided in a range that overlaps the well region 11. In another example, the outer circumferential gate runner 130-2 may extend to a position that overlaps the first conductivity type region 84 between the well region 11 and the first guard ring 92-1. Note that the in a direction connecting the well region 11 and the first guard ring 92-1 (for example, the X axis direction), the first conductivity type region 84 in the present example has a portion 83 that overlaps neither the first field plate 93-1 nor the outer circumferential gate runner 130-2. A distance between the portion 83 and the well region 11 is smaller than a distance between the portion 83 and the first guard ring 92-1.

Figure 7:
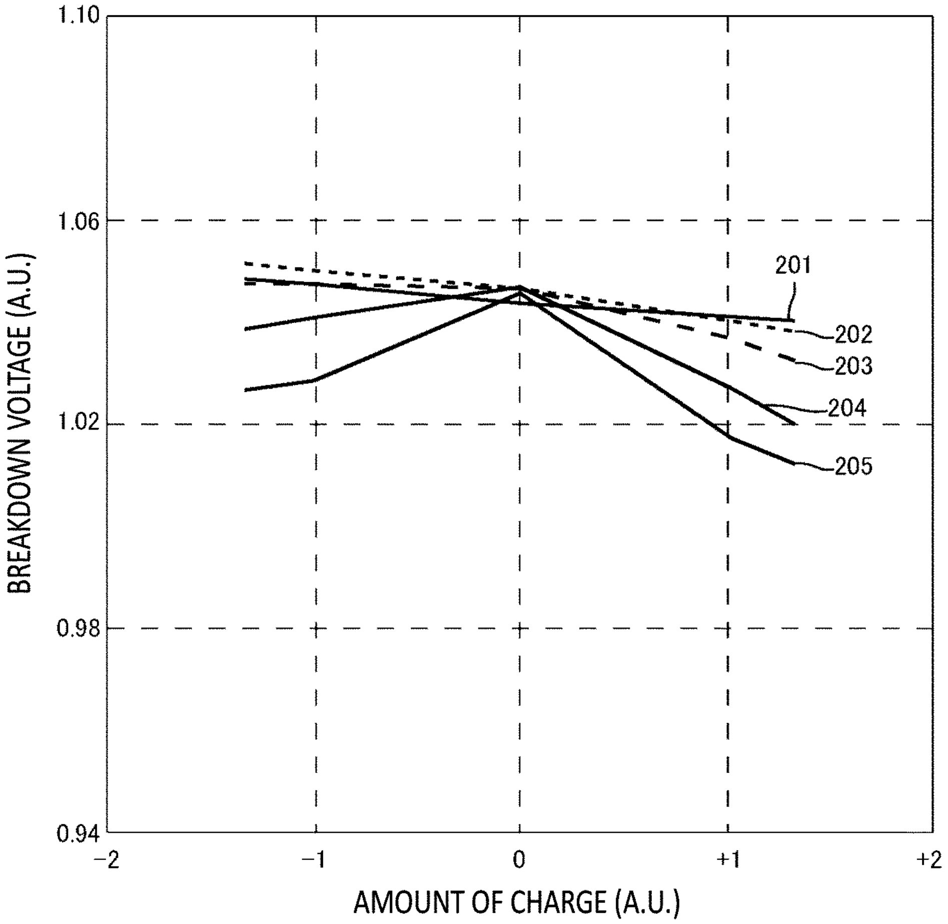
FIG. 7 is a diagram for describing a change in breakdown voltage of the semiconductor device 100.

FIG. 7 is a diagram for describing a change in breakdown voltage of the semiconductor device 100. FIG. 7 shows a characteristic of an amount of charge-breakdown voltage, in which the horizontal axis represents the amount of charge that is accumulated at the upper surface of the interlayer dielectric film 38 between the well region 11 and the first guard ring 92-1, and the vertical axis represents the breakdown voltage of the semiconductor device 100. The positive and negative on the horizontal axis represents the positive and negative of the charge, and a value on the horizontal axis represents a relative value of the amount of charge. A value on the vertical axis represents a relative value of the breakdown voltage.

A characteristic 205 shows a characteristic of an example in which the length L2 of the first field plate 93-1 is 0 μm, that is, an example in which the first field plate 93-1 is provided only in a range that overlaps the first guard ring 92-1. A characteristic 204 is, for an example, a characteristic of an example in which a length L1-L2 is 2.0 μm, that is, the length of portion 83 (refer to FIG. 6) is 2.0 μm. A characteristic 203 is a characteristic of an example in which the length L1-L2 of the portion 83 is 1.0 μm. Note that in the characteristic 203, a ratio of the length L2 to the length L1 is 90% or more. A characteristic 202 is a characteristic of an example in which the length L1-L2 is 0 μm, that is, a position of an end portion of the first field plate 93-1 and a position of an end portion of the well region 11 match each other. A characteristic 201 is a characteristic of an example in which the length L1-L2 is −1.0 μm, that is, a length of an overlapping portion of the first field plate 93-1 and the well region 11 is 1.0 μm.

As shown in the characteristic 205, when the first field plate 93-1 does not cover the first conductivity type region 84 at all, by the charge being accumulated at the upper surface of the interlayer dielectric film 38, the breakdown voltage is greatly changed. In the characteristic 204, the first field plate 93-1 covers the first conductivity type region 84; however, the portion 83 is relatively great. In this case, by the charge being accumulated at the upper surface of the interlayer dielectric film 38, the breakdown voltage is changed.

On the other hand, as shown in the characteristics 201, 202, and 203, by the first field plate 93-1 covering 90% or more of the first conductivity type region 84, even when the charge is accumulated at the upper surface of the interlayer dielectric film 38, the breakdown voltage is hardly changed. That is, by the first field plate 93-1 covering 90% or more of the first conductivity type region 84, it is possible to significantly suppress the reduction in breakdown voltage of the semiconductor device 100.

Figure 8:
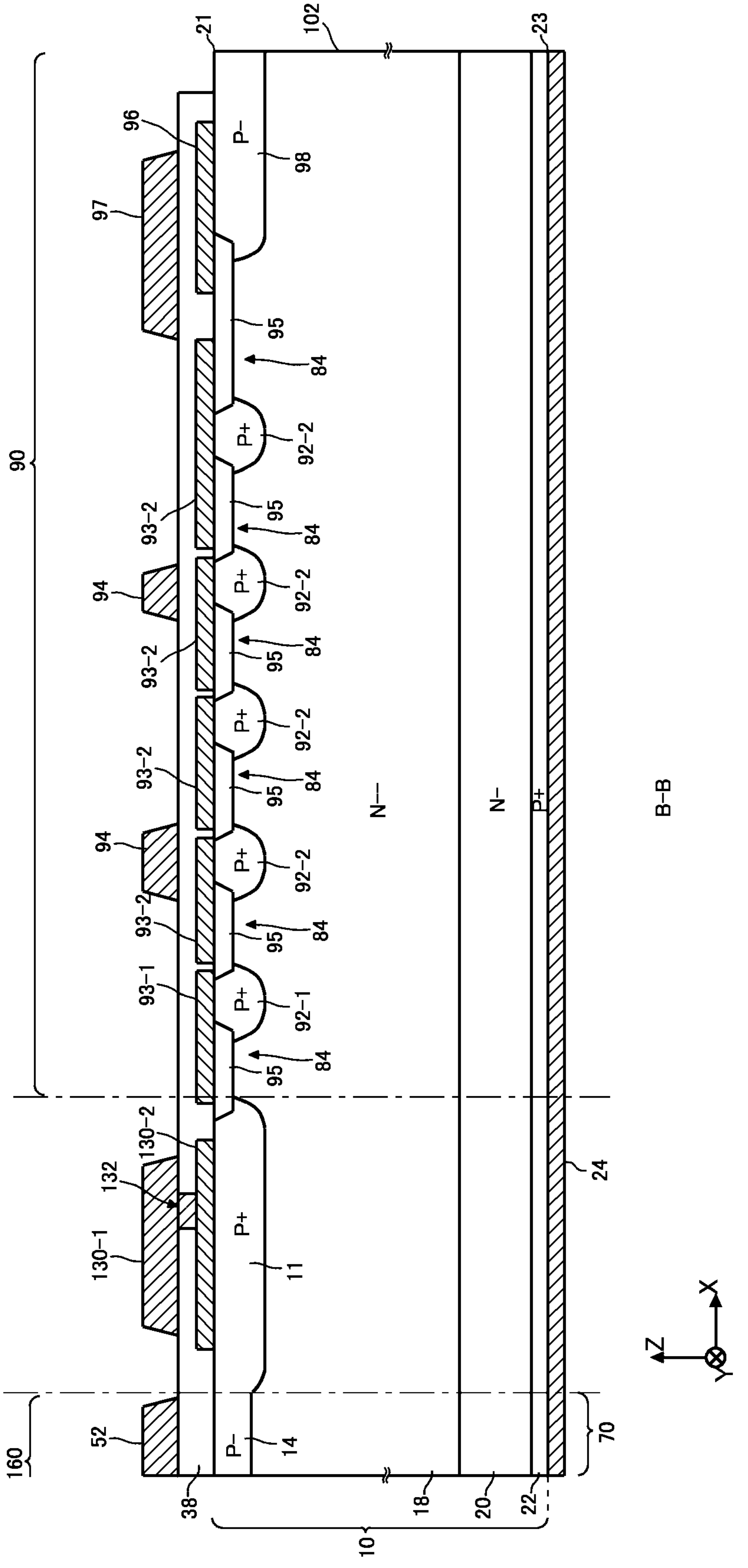
FIG. 8 is a diagram showing another structural example of an edge termination structure portion 90.

FIG. 8 is a diagram showing another structural example of an edge termination structure portion 90. Structures of the edge termination structure portion 90 of the present example, other than the second field plate 93-2, are similar to those of any of the examples described in the present specification and drawing.

In the present example, at least one of the one or more second field plates 93-2 is provided from above the corresponding second guard ring 92-2 of the guard rings 92 to above another guard ring 92 of the guard rings 92 adjacent to the corresponding second guard ring 92-2 in the top view. That is, the first conductivity type region 84 between the respective guard rings 92 is covered with the second field plate 93-2. In another example, a ratio of the second field plate 93-2 covering the first conductivity type region 84 may be 90% or more, or may be 95% or more. In the present example, the second field plate 93-2 connected to the second guard ring 92-2 on an outside (an end side 102 side) is provided to extend toward the guard ring 92 on an inside (a well region 11 side).

At least one of the one or more second field plates 93-2 may cover a part of the another guard ring 92 of the guard rings 92 adjacent to the corresponding second guard ring 92-2. Note that the second field plate 93-2 does not cover the other guard ring 92 entirely. In this case, above the other guard ring 92, the field plate 93 connected to the guard ring 92 and a second field plate 93-2 extending from the adjacent guard ring 92 are arranged.

All of the second field plates 93-2 may extend toward the adjacent guard rings 92, as shown in FIG. 8. Each second field plate 93-2 may cover 90% or more of the first conductivity type region 84, may cover 95% or more, or may cover 100%.

In addition, the second field plate 93-2 connected to the second guard ring 92-2 adjacent to the channel stopper 98 may be provided to extend toward the channel stopper 98. The second field plate 93-2 may cover a part or all of the first conductivity type region 84 between the second guard ring 92-2 and the channel stopper 98. In the example of FIG. 8, the second field plate 93-2 covers a part of the first conductivity type region 84. The second field plate 93-2 may extend to a position that overlaps the outer plate 96 or the outer electrode 97. This makes it possible to cover the entire first conductivity type region 84 with the second field plate 93-2, the outer plate 96, and the outer electrode 97.

Figure 9:
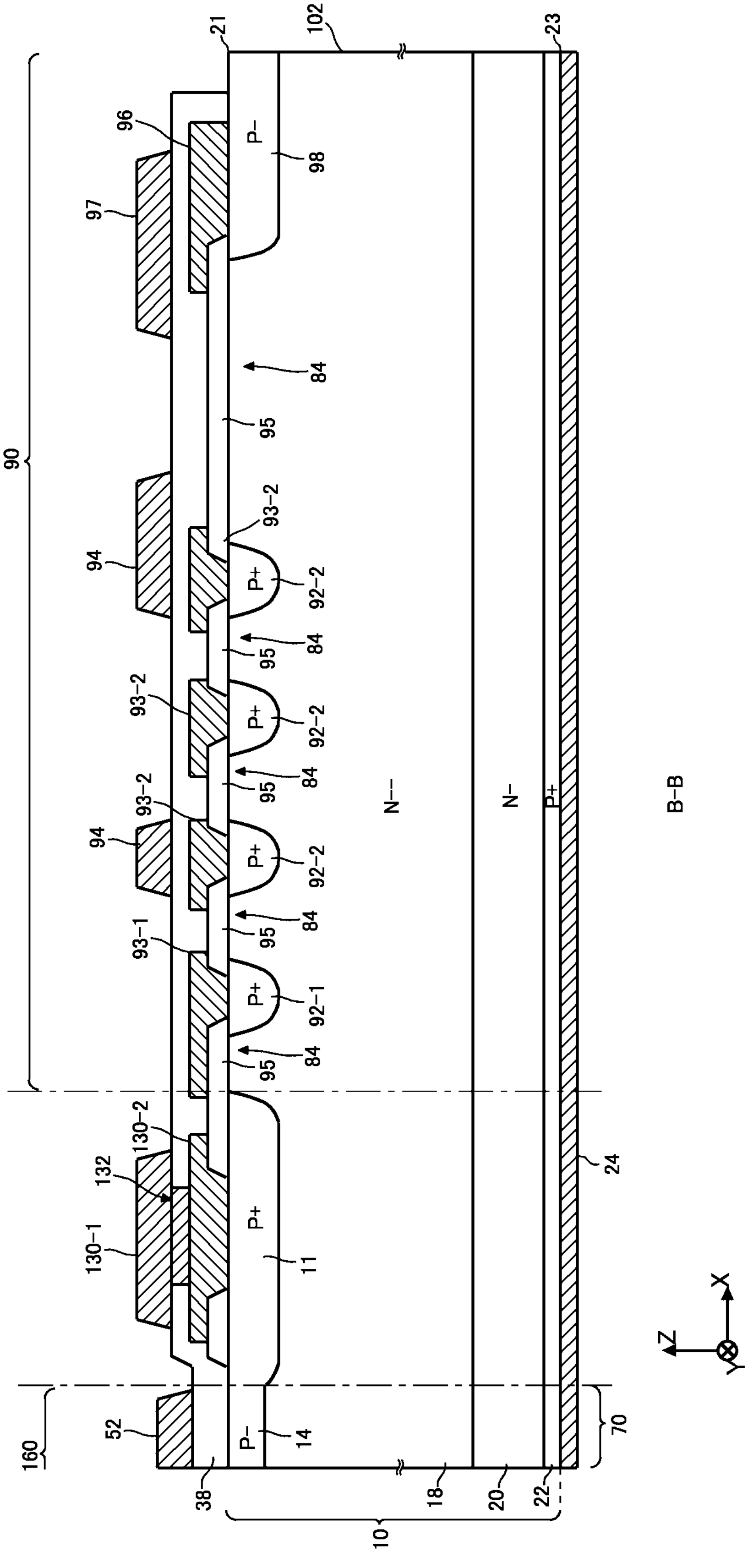
FIG. 9 is a diagram showing another example of the semiconductor device 100.

FIG. 9 is a diagram showing another example of the semiconductor device 100. Structures of the semiconductor device 100 of the present example, other than the dielectric film 95, are similar to those of any of the examples described in the present specification and drawing. At least a part of the dielectric film 95 of the present example is arranged above the upper surface 21 of the semiconductor substrate 10. The upper surface 21 in this case refers to the uppermost surface, among the surfaces of the semiconductor substrate 10. That is, when the groove is formed at the upper surface 21, the bottom surface of the groove does not correspond to the upper surface 21 of the present example.

The dielectric film 95 may be arranged above the upper surface 21 by 50% or more of the thickness in the Z axis direction, may be arranged above the upper surface 21 by 80% or more of the thickness in the Z axis direction, or may be arranged above the upper surface 21 by 100% of the thickness in the Z axis direction. The dielectric film 95 of the present example is a thermal oxide film formed by oxidizing the upper surface 21 that is flat. With the present example, it is possible to easily form the dielectric film 95. In any of the examples described in the present specification and drawing, the dielectric film 95 shown in FIG. 3 may be applied, or the dielectric film 95 shown in FIG. 9 may be applied.

Figure 10:
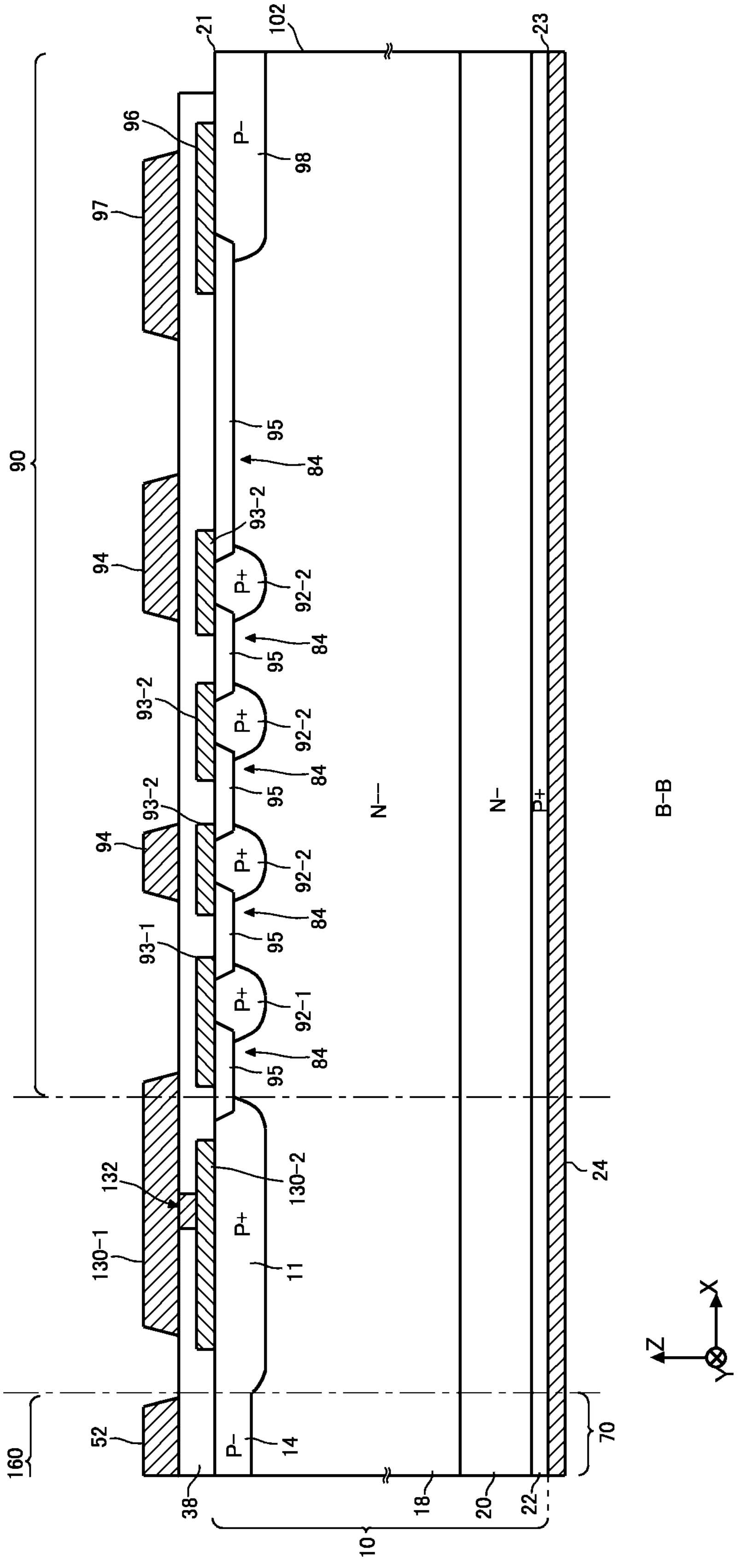
FIG. 10 shows another example of the semiconductor device 100.

FIG. 10 shows another example of the semiconductor device 100. Structures of the semiconductor device 100 of the present example, other than the first field plate 93-1 and the outer circumferential gate runner 130, are similar to those of any of the examples described in the present specification and drawing. The first field plate 93-1 and the outer circumferential gate runner 130 of the present example are arranged to overlap in the top view. In the example of FIG. 10, the first field plate 93-1 and the outer circumferential gate runner 130-1 overlap; however, the first field plate 93-1 and the outer circumferential gate runner 130-2 may overlap. The first field plate 93-1 of the present example may cover only a part of the first conductivity type region 84 between the well region 11 and the first guard ring 92-1, or may cover the entirety.

Figure 11:
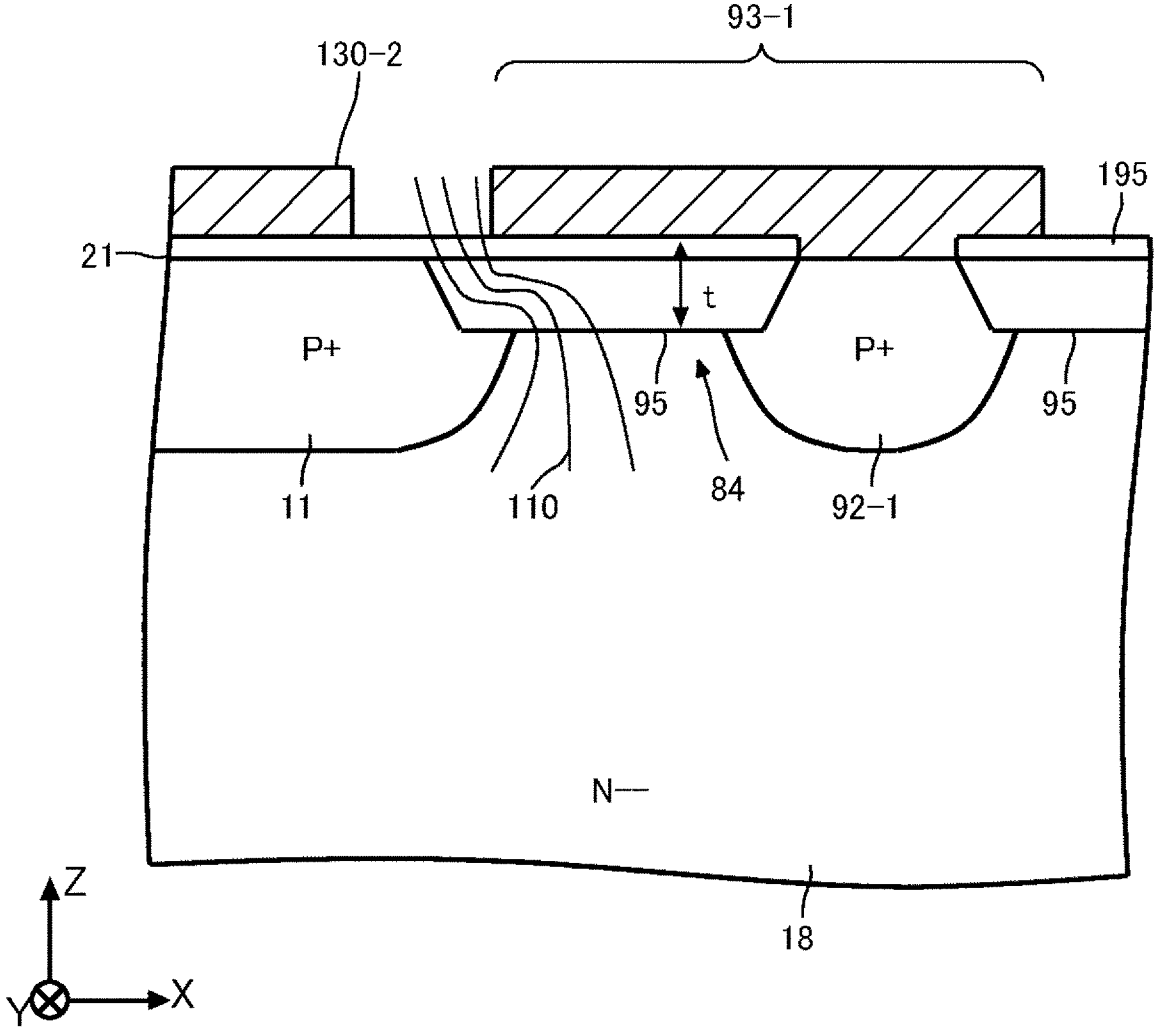
FIG. 11 is a diagram for describing a thickness t of a dielectric film provided between a field plate 93 and a semiconductor substrate 10.

FIG. 11 is a diagram for describing a thickness t of a dielectric film provided between a field plate 93 and a semiconductor substrate 10. In FIG. 11, the thickness t of the dielectric film below the first field plate 93-1 is described; however, the thickness t of the dielectric film below the second field plate 93-2 may also be similar. In the present example, t is set as a sum of the thicknesses of the dielectric film 95 and the dielectric film 195 below the first field plate 93-1. In addition, the dielectric film 95 and the dielectric film 195 are collectively referred to as the dielectric film 95 or the like.

Since the first field plate 93-1 extends toward the well region 11, equipotential lines 110 entering the dielectric film 95 or the like from the first conductivity type region 84 extend inside the dielectric film 95 or the like toward the X axis direction. Therefore, when the thickness t of the dielectric film 95 or the like is small, an interval between the equipotential lines 110 inside the dielectric film 95 or the like becomes small, and an electric field intensity which is applied per unit thickness of the dielectric film 95 or the like becomes great. Therefore, it is preferable for the thickness t (cm) of the dielectric film 95 or the like, to satisfy the following expression. The thickness t may be a thickness in the Z axis direction.

$$(\phi_0-\phi_1)/E_C<t \quad \text{Expression (1)}$$

where $\phi_0$ is a potential (an emitter potential, V in the present example) of the well region when a reverse bias of a rated voltage is applied between the emitter electrode 52 and the collector electrode 24; $\phi_1$ is a potential (V) of the first field plate 93-1 when the reverse bias of the rated voltage is applied between the emitter electrode 52 and the collector electrode 24; and $E_C$ is a critical electric field intensity (V/cm). In addition, it is preferable for the thickness t of the dielectric film or the like below the second field plate 93-2, to satisfy the following expression.

$$(\phi_n-\phi_{n+1})/E_C<t \quad \text{Expression (2)}$$

where $\phi_{n+1}$ is a potential of the second field plate 93-2 when the reverse bias of the rated voltage is applied between the emitter electrode 52 and the collector electrode 24; and $\phi_n$ is a potential of the field plate 93 arranged on the inside further than the second field plate 93-2 by one when the reverse bias of the rated voltage is applied between the emitter electrode 52 and the collector electrode 24.

A potential difference $\phi_0-\phi_1$ or $\phi_n-\phi_{n+1}$ may be approximated by using a value X obtained by dividing the rated voltage described above by the number of guard rings 92 arranged from the well region 11 to the end side 102. For example, when the rated voltage is 1200V and the number of guard rings 92 is 12, the potential difference described above can be approximated by using X=100V. The potential difference described above may be 0.5 times or more and 2 times or less of the value X. The potential difference described above may be 0.7 times or more, may be 0.9 times or more, or may be one time of the value X. The potential difference described above may be 1.5 times or less, or may be 1.1 times or less of the value X. Note that the potential described above is able to be calculated by a well known device simulation.

Figure 12:
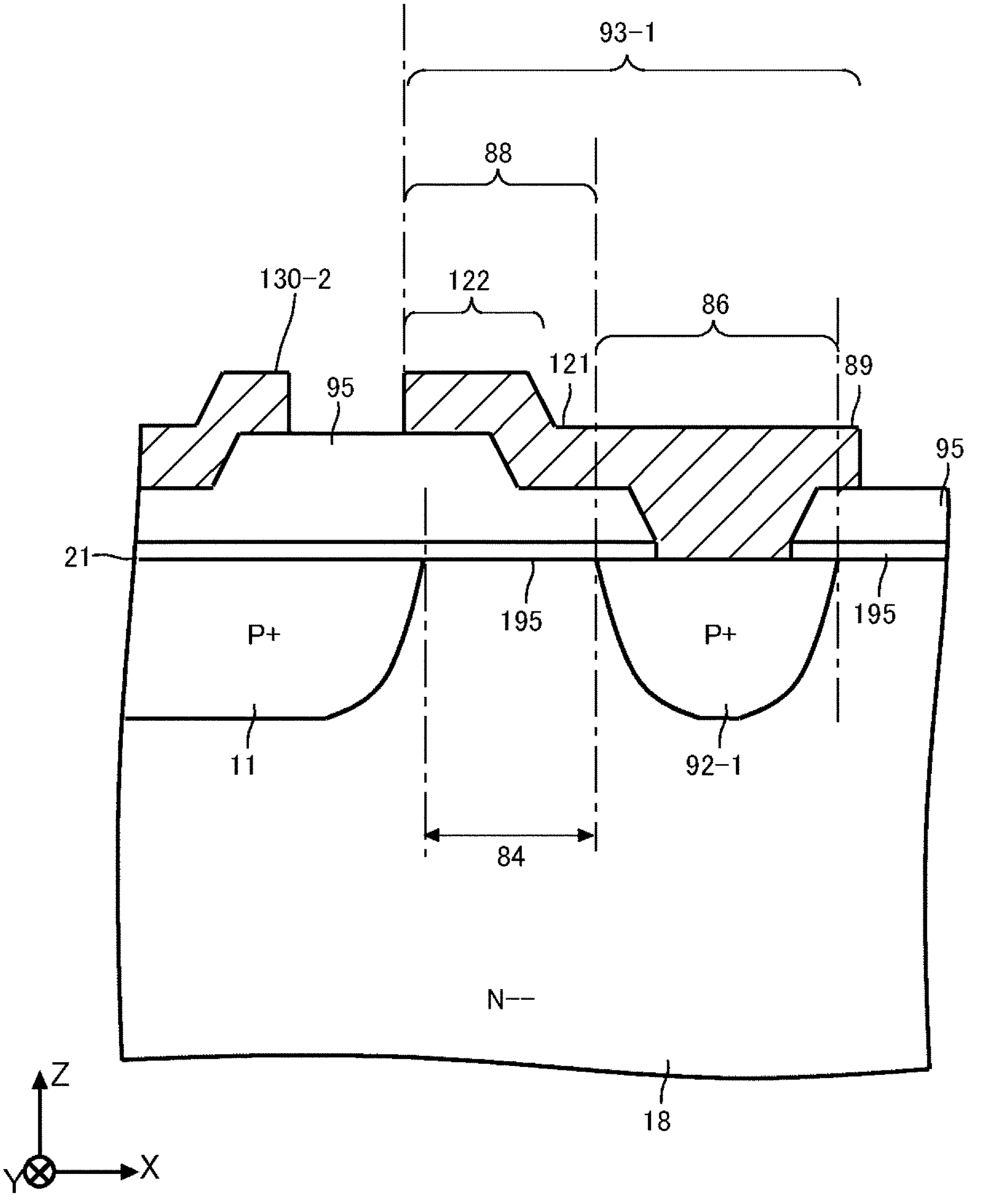
FIG. 12 is a diagram showing a structural example of the field plate 93.

FIG. 12 is a diagram showing a structural example of the field plate 93. The first field plate 93-1 is shown; however, the second field plate 93-2 may also have a similar structure. The inner extension portion 88 of the first field plate 93-1 in the present example has a first portion 121 and a second portion 122.

The first portion 121 is connected to the upper portion 86 and extends from the upper portion 86 in the direction of the well region 11. The first portion 121 is arranged above the first conductivity type region 84. The second portion 122 is connected to the first portion 121 and extends from the first portion 121 in the direction of the well region 11. The first portion 121 may extend to above the well region 11, or may be provided not to overlap the well region 11.

At least a part of the second portion 122 is arranged above the first portion 121. In this manner, the thickness of the dielectric film 95 below the second portion 122 is greater than the thickness of the dielectric film 95 below the first portion 121. The thickness of the dielectric film 95 below the second portion 122 may be 1.3 times or more, may be 1.5 times or more, or may be 2 times or more of the thickness of the dielectric film 95 below the first portion 121.

Since the number of equipotential lines 110 that extends inside the dielectric film 95 in the X axis direction increases as an edge of the inner extension portion 88 is approached, an electric field tends to be concentrated. In contrast with this, with the present example, it is possible to increase the thickness of the dielectric film 95 below a vicinity of the edge of the inner extension portion 88, and thus it is possible to relax the electric field concentration and to suppress the dielectric breakdown.

In FIG. 12, the inner extension portion 88 has been described as an example; however, the outer extension portion 89 may have the first portion 121 and the second portion 122. In this case, the first portion 121 is a portion that is connected to the upper portion 86 and extends in the direction of the end side 102. In addition, the second portion 122 is a portion that is connected to the first portion 121 and extends in the direction of the end side 102.

In addition, the outer circumferential gate runner 130 may have the first portion 121 and the second portion 122. In the example of FIG. 12, the outer circumferential gate runner 130-2 has the first portion 121 and the second portion 122.

Figure 13:
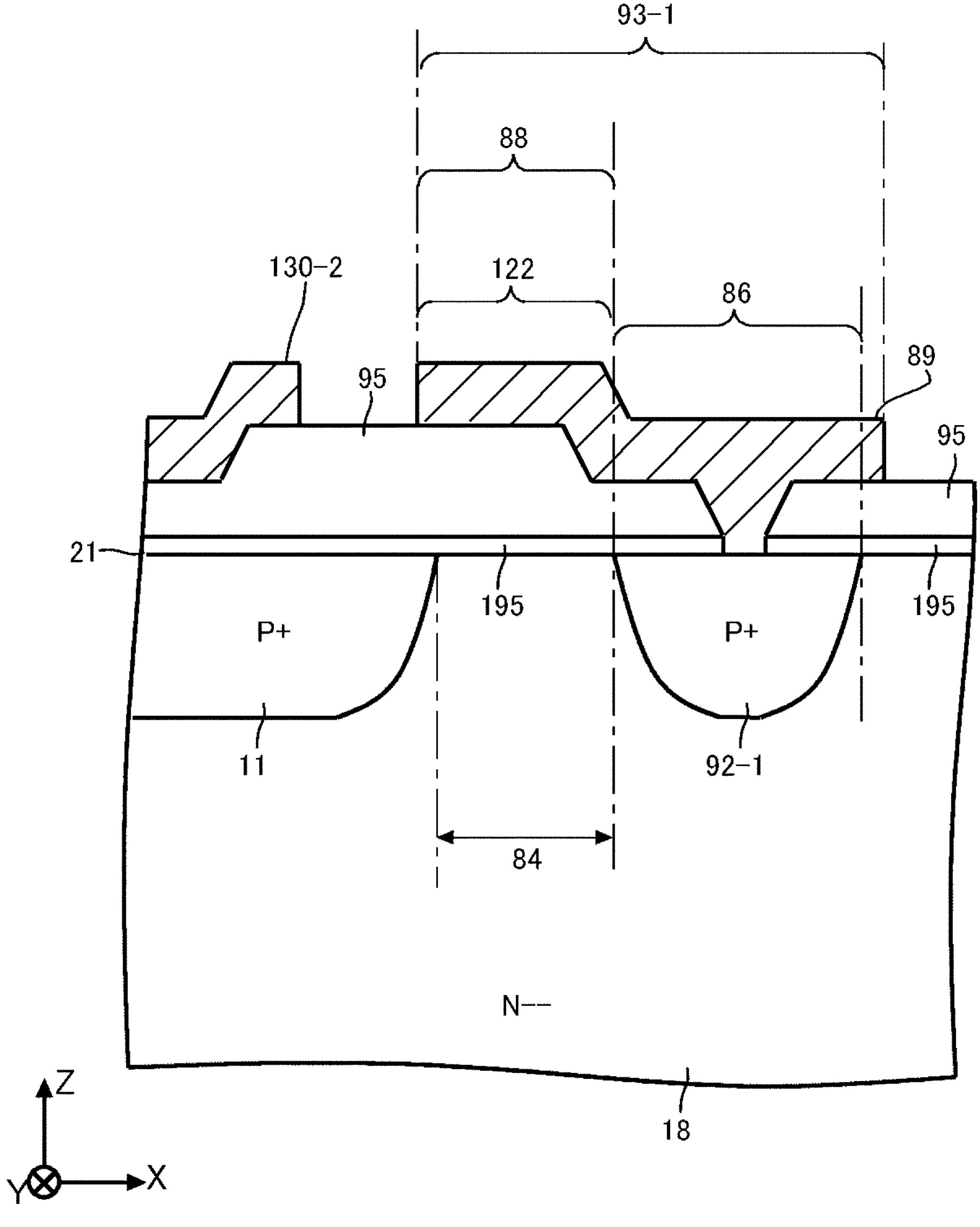
FIG. 13 is a diagram showing another structural example of the inner extension portion 88.

FIG. 13 is a diagram showing another structural example of the inner extension portion 88. The inner extension portion 88 of the present example has the second portion 122. The second portion 122 in the present example is connected to the upper portion 86 and extends toward the well region 11. The second portion 122 is arranged above the upper portion 86. With the present example as well, it is possible to relax the electric field concentration in the dielectric film 95. Similar to the example described in FIG.

12, the structure shown in FIG. 13 may be applied to the outer extension portion 89, may be applied to at least one of the inner extension portion 88 or the outer extension portion 89 of the second field plate 93-2, or may be applied to the outer circumferential gate runner 130.

Figure 14:
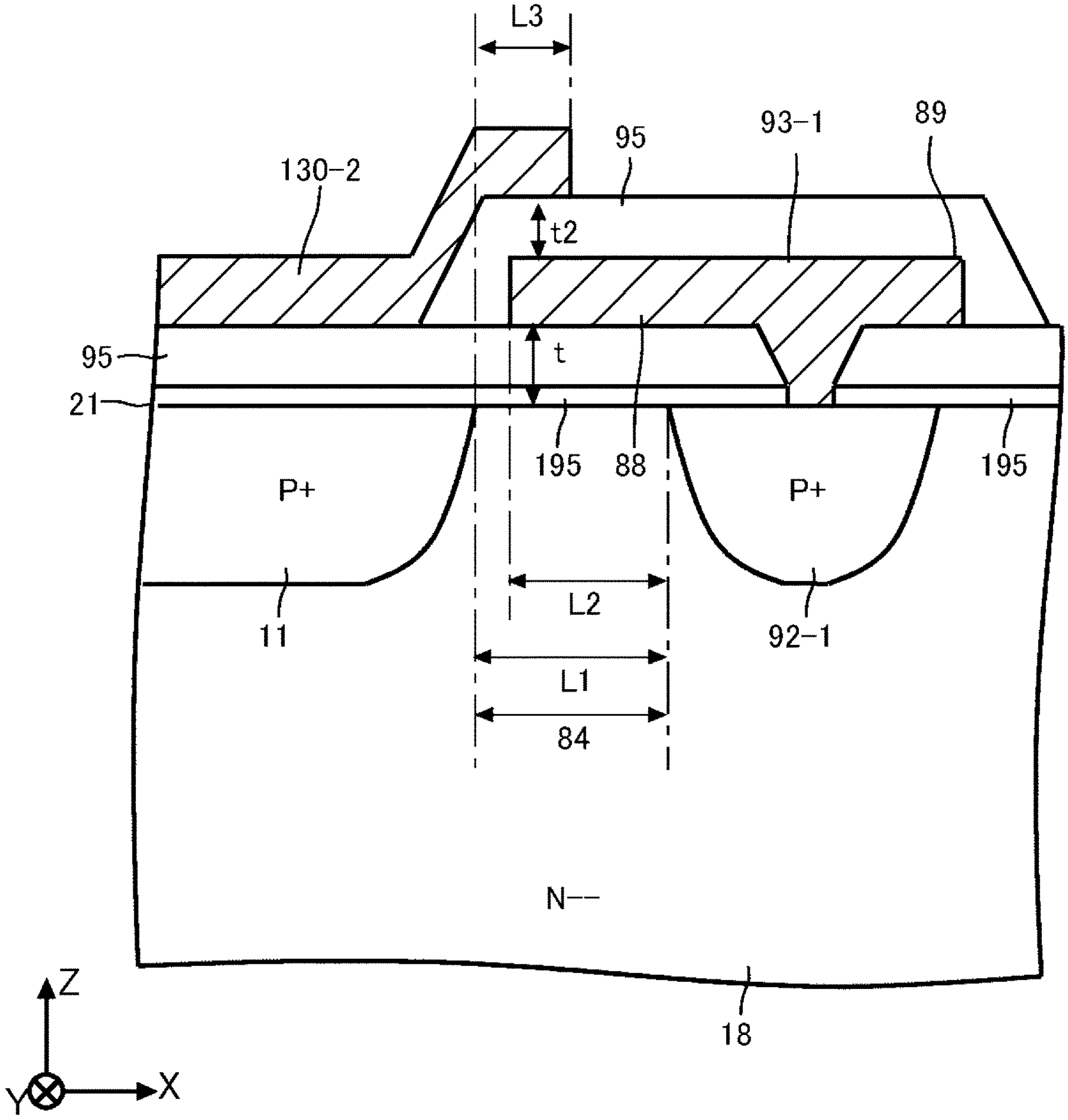
FIG. 14 is a diagram showing a structural example of the first field plate 93-1 and an outer circumferential gate runner 130.

FIG. 14 is a diagram showing a structural example of the first field plate 93-1 and an outer circumferential gate runner 130. Structures other than the first field plate 93-1 and the outer circumferential gate runner 130, are similar to those of any of the examples described in the present specification and drawing.

The first field plate 93-1 of the present example is provided to a position that overlaps the outer circumferential gate runner 130. In the example of FIG. 14, the first field plate 93-1 overlaps the outer circumferential gate runner 130-2. The length L2 of the first field plate 93-1 may be shorter than the length L1 of the first conductivity type region 84, may be the same as the length L1, or may be longer than the length L1.

The outer circumferential gate runner 130-2 may be provided to extend to a position that overlaps the first conductivity type region 84. A part of the inner extension portion 88 of the first field plate 93-1 of the present example is provided between the outer circumferential gate runner 130-2 and the semiconductor substrate 10. Between the inner extension portion 88 and the outer circumferential gate runner 130-2, the dielectric film 95 is provided to separate the inner extension portion 88 and the outer circumferential gate runner 130-2. The equipotential line 110 in FIG. 11 passes through the dielectric film 95. It is also preferable for a thickness t2 of the dielectric film 95 between the inner extension portion 88 and the outer circumferential gate runner 130-2, to satisfy Expression (1).

With the present example, even when the charge reaches the upper surface of the dielectric film 95 between the inner extension portion 88 and the outer circumferential gate runner 130-2, the extraction is possible by the outer circumferential gate runner 130-2, and thus the accumulation of the charge can be suppressed. In addition, by providing the first field plate 93-1 in which the potential becomes high, below the outer circumferential gate runner 130-2, the depletion layer is less likely to extend in the X axis direction, and it is possible to shorten the edge termination structure portion 90.

The length L2 by which the inner extension portion 88 of the first field plate 93-1 overlaps the first conductivity type region 84 may be greater than a length L3 by which the outer circumferential gate runner 130-2 overlaps the first conductivity type region 84. Note that a relationship of L2>L3 is similar also in a case where the inner extension portion 88 does not overlap the outer circumferential gate runner 130-2.

Figure 15:
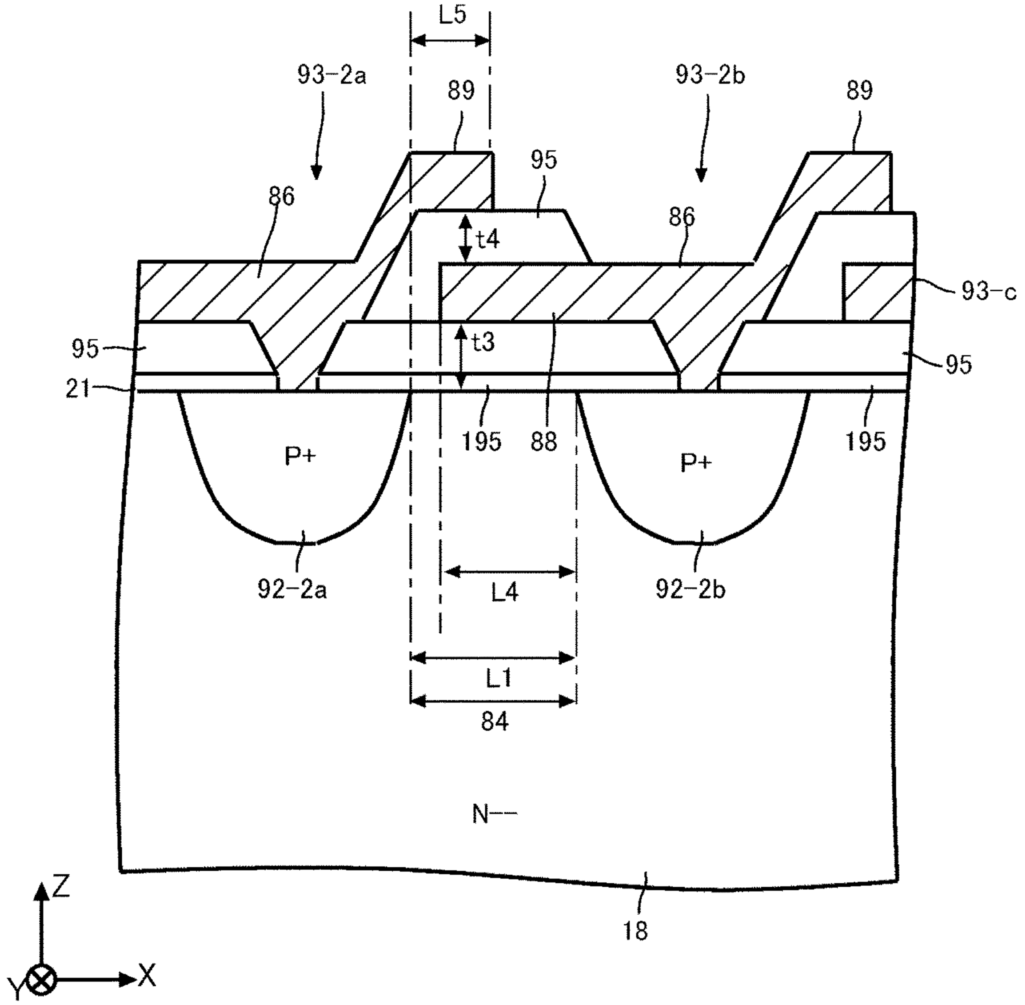
FIG. 15 is a diagram showing a structural example of a second field plate 93-2.

FIG. 15 is a diagram showing a structural example of a second field plate 93-2. FIG. 15 shows two second guard rings 92-2*a* and 92-2*b* that are adjacent to each other, and two adjacent second field plates 93-2*a* and 93-2*b*. The second field plate 93-2*b* is arranged on an outside of the second field plate 93-2*a*. The second guard ring 92-2*b* is arranged on an outside of the second guard ring 92-2*a*.

The two second field plates 93-2 that are adjacent to each other in the present example, have portions that overlap each other in the top view. Similar to the example of FIG. 14, in the present example as well, between the two second field plates 93-2 that overlap each other, a part of the second field plate 93-2*b* arranged farther from the well region 11, is arranged below the other second field plate 93-2*a*.

Each second field plate 93-2 has the upper portion 86, the inner extension portion 88, and the outer extension portion 89, similar to the first field plate 93-1. The inner extension portion 88 of the second field plate 93-2*b* on the outside is provided to a position that overlaps the outer extension portion 89 of the second field plate 93-2*a* on an inside. A length L4 of each inner extension portion 88 may be shorter than the length L1 of the first conductivity type region 84, may be the same as the length L1, or may be longer than the length L1.

Each outer extension portion 89 may be provided to extend to a position that overlaps the first conductivity type region 84. In the present example, a part of the inner extension portion 88 of the second field plate 93-2*b* on the outside is provided between the outer extension portion 89 of the second field plate 93-2*a* on the inside and the semiconductor substrate 10. Between the inner extension portion 88 and the outer extension portion 89, the dielectric film 95 is provided to separate the inner extension portion 88 and the outer extension portion 89. It is preferable for a thickness t4 of the dielectric film 95 that separates the inner extension portion 88 and the outer extension portion 89, to satisfy Expression (2). In addition, it is also preferable for a thickness t3 of the dielectric film 95 or the like below the inner extension portion 88, to satisfy Expression (2).

The length L4 by which the inner extension portion 88 of the second field plate 93-2*b* on the outside overlaps the first conductivity type region 84 may be greater than a length L5 by which the outer extension portion 89 of the second field plate 93-2*a* on the inside overlaps the first conductivity type region 84. That is, the inner extension portion 88 is longer than the outer extension portion 89 in the direction connecting the well region 11 and the end side 102 of the semiconductor substrate 10. Note that a relationship of L4>L5 is similar also in a case where the inner extension portion 88 does not overlap the outer extension portion 89.

While the present invention has been described with the embodiments, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

What is claimed is:

1. A semiconductor device comprising:

a semiconductor substrate that has an upper surface and a lower surface, has a bulk donor, and is provided with a drift region of a first conductivity type having a bulk donor concentration;

an active portion that is provided in the semiconductor substrate;

an edge termination structure portion that is provided between the active portion and an end side of the semiconductor substrate, in the semiconductor substrate; and a well region of a second conductivity type that is provided between the active portion and the edge termination structure portion, and is exposed to the upper surface of the semiconductor substrate, in the semiconductor substrate, wherein the edge termination structure portion has one or more guard rings of the second conductivity type that are provided between the well region and the end side of the semiconductor substrate, and are exposed to the upper surface of the semiconductor substrate, a first conductivity type region that is provided between a first guard ring that is closest to the well region, among the one or more guard rings, and the well region, and a first field plate that is provided above the upper surface of the semiconductor substrate, and is connected to the first guard ring, and a dielectric film that is in contact with at least a part of the first conductivity type region, a part of the well region or a part of one of the guard ring;

the first field plate includes an upper portion that overlaps the first guard ring above the first guard ring, and an extension portion that extends from the upper portion in a direction of the well region, and overlaps 90% or more of the first conductivity type region between the first guard ring and the well region, wherein the first conductivity type region that is in contact with both the well region and the dielectric film is the drift region.

2. The semiconductor device according to claim 1, wherein the first field plate contains polysilicon.

3. The semiconductor device according to claim 1, further comprising:

a well plate that is provided above the well region, wherein in a direction connecting the well region and the first guard ring, a length by which the extension portion of the first field plate overlaps the first conductivity type region, is greater than a length by which the well plate overlaps the first conductivity type region.

4. The semiconductor device according to claim 3, wherein in the direction connecting the well region and the first guard ring, the first conductivity type region has a portion that overlaps neither the first field plate nor the well plate.

5. The semiconductor device according to claim 1, wherein the first field plate is provided to a position that overlaps the well region.

6. The semiconductor device according to claim 3, wherein the first field plate is provided to a position that overlaps the well plate.

7. The semiconductor device according to claim 6, wherein between the first field plate and the well plate, a dielectric film that separates the first field plate and the well plate is provided.

8. The semiconductor device according to claim 6, wherein a part of the first field plate is provided between the well plate and the semiconductor substrate.

9. The semiconductor device according to claim 1, further comprising:

one or more second field plates that are provided above the upper surface of the semiconductor substrate, and are connected to the guard rings other than the first guard ring, wherein at least one of the one or more second field plates is provided from above one guard ring of the guard rings to above another guard ring of the guard rings adjacent to the one guard ring.

10. The semiconductor device according to claim 9, wherein the at least one of the one or more second field plates cover a part of the another guard ring of the guard rings adjacent to the one guard ring.

11. The semiconductor device according to claim 1, further comprising:

two or more second field plats that are provided above the upper surface of the semiconductor substrate, and are connected to the guard rings other than the first guard ring, wherein the two second field plates provided in the two guard rings that are adjacent to each other, have portions that overlap each other.

12. The semiconductor device according to claim 11, wherein between the two second field plates that overlap each other, the second field plate arranged farther from the well region, is arranged below the other second field plate.

13. The semiconductor device according to claim 11, wherein each of the two second field plates that overlap each other has an upper portion that overlaps the guard ring above the guard ring, between the two second field plates that overlap each other, the second field plate arranged farther from the well region, has an inner extension portion that extends from the upper portion in the direction of the well region, between the two second field plates that overlap each other, the other second field plate has an outer extension portion that extends from the upper portion in a direction away from the well region, and the inner extension portion is longer than the outer extension portion in a direction connecting the well region and the end side of the semiconductor substrate.

14. The semiconductor device according to claim 1, further comprising:

a dielectric film provided between the first field plate and the semiconductor substrate, wherein at least a part of the dielectric film is arranged inside the semiconductor substrate.

15. The semiconductor device according to claim 1, further comprising:

a dielectric film provided between the first field plate and the semiconductor substrate, wherein at least a part of the dielectric film is arranged above the upper surface of the semiconductor substrate.

16. The semiconductor device according to claim 14, wherein a thickness of the dielectric film provided below the first field plate satisfies the following expression $$(\phi_0-\phi_1)/E_c<t$$

where $\phi_0$ is a potential of the well region, $\phi_1$ is a potential of the first field plate, t is the thickness of the dielectric film, and $E_c$ is a critical electric field intensity of the dielectric film.

17. The semiconductor device according to claim 1, wherein the extension portion of the first field plate has a first portion that is connected to the upper portion and extends from the upper portion in the direction of the well region, and a second portion which is connected to the first portion, extends from the first portion in the direction of the well region, and in which at least a part is arranged above the first portion.

18. The semiconductor device according to claim 1, wherein a base region of the second conductivity type is provided in the active portion, and the well region is provided from the upper surface of the semiconductor substrate to a position deeper than the base region.

19. The semiconductor device according to claim 1, further comprising:

a channel stopper that is provided in contact with the end side and the upper surface of the semiconductor substrate;

one or more second field plates that are provided above the upper surface of the semiconductor substrate, and are connected to the guard rings other than the first guard ring; and a first conductivity type region provided between the guard ring connected to the second field plate adjacent to the channel stopper, and the channel stopper, wherein the second field plate adjacent to the channel stopper covers part of the first conductivity type region between the guard ring and the channel stopper.

20. The semiconductor device according to claim 1, further comprising:

two or more second field plates that are provided above the upper surface of the semiconductor substrate, and a dielectric film provided between the second field plate and the semiconductor substrate, wherein a thickness of the dielectric film provided below the second field plate satisfies the following expression $$(\phi_n-\phi_{n+1})/E_c<t$$

where $\phi_{n+1}$ is a potential of the second field plate, $\phi_n$ is a potential of the second field plate arranged on a well region side further than the second field plate with $\phi_{n+1}$ by one, t is the thickness of the dielectric film, and $E_c$ is a critical electric field intensity of the dielectric film.

21. The semiconductor device according to claim 11, further comprising:

a dielectric film that separates the two second field plates provided in the two guard rings that are adjacent to each other, wherein a thickness of the dielectric film satisfies the following expression $$(\phi_n-\phi_{n+1})/E_c<t$$

where $\phi_{n+1}$ is a potential of the second field plate, $\phi_n$ is a potential of the second field plate arranged on a well region side further than the second field plate with $\phi_{n+1}$ by one, t is the thickness of the dielectric film, and $E_c$ is a critical electric field intensity of the dielectric film.

22. A semiconductor device comprising:

a semiconductor substrate that has an upper surface and a lower surface, and is provided with a drift region of a first conductivity type;

an active portion that is provided in the semiconductor substrate;

an edge termination structure portion that is provided between the active portion and an end side of the semiconductor substrate, in the semiconductor substrate; and a well region of a second conductivity type that is provided between the active portion and the edge termination structure portion, and is exposed to the upper surface of the semiconductor substrate, in the semiconductor substrate, wherein the edge termination structure portion has one or more guard rings of the second conductivity type that are provided between the well region and the end side of the semiconductor substrate, and are exposed to the upper surface of the semiconductor substrate, a first conductivity type region that is provided between a first guard ring that is closest to the well region, among the one or more guard rings, and the well region, and a first field plate that is provided above the upper surface of the semiconductor substrate, and is connected to the first guard ring, and the first field plate includes an upper portion that overlaps the first guard ring above the first guard ring, and an extension portion that extends from the upper portion in a direction of the well region, and overlaps 90% or more of the first conductivity type region between the first guard ring and the well region, wherein the first field plate is provided to a position that overlaps the well region.

* * * * *